United States Patent
Long

(10) Patent No.: US 11,139,339 B2
(45) Date of Patent: Oct. 5, 2021

(54) ARRAY SUBSTRATE, METHOD OF MANUFACTURING THE SAME, AND DISPLAY DEVICE

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 143 days.

(21) Appl. No.: 16/461,419

(22) PCT Filed: Nov. 16, 2018

(86) PCT No.: PCT/CN2018/115793
§ 371 (c)(1),
(2) Date: May 16, 2019

(87) PCT Pub. No.: WO2019/174290
PCT Pub. Date: Sep. 19, 2019

(65) Prior Publication Data
US 2020/0258937 A1    Aug. 13, 2020

(30) Foreign Application Priority Data
Mar. 16, 2018    (CN) .......................... 201810220239.8

(51) Int. Cl.
*H01L 27/15* (2006.01)
*H01L 29/49* (2006.01)
(Continued)

(52) U.S. Cl.
CPC ........ *H01L 27/156* (2013.01); *H01L 29/4908* (2013.01); *H01L 29/517* (2013.01);
(Continued)

(58) Field of Classification Search
CPC ....... H01L 27/156; H01L 27/32; H01L 27/12; H01L 27/15; H01L 29/4908;
(Continued)

(56) References Cited

U.S. PATENT DOCUMENTS 10,090,335 B2 * 10/2018 Kang ................... H01L 33/486
2012/0009710 A1 * 1/2012 Kim ................... H01L 29/78621
438/46

(Continued)

FOREIGN PATENT DOCUMENTS

CN    101847646 A    9/2010
CN    104112755       10/2014
(Continued)

OTHER PUBLICATIONS

Search Report and Written Opinion for International Application No. PCT/CN2018/115793 dated Feb. 21, 2019.
(Continued)

*Primary Examiner* — Robert G Bachner
(74) *Attorney, Agent, or Firm* — Calfee, Halter & Griswold LLP

(57) ABSTRACT

An array substrate including a base substrate; a thin film transistor disposed on the base substrate, the thin film transistor including a gate electrode connected to a gate line; an active layer; a gate insulating layer insulating the gate electrode from the active layer; a first electrode connected to a data line; and a second electrode spaced apart from the first electrode; a micro light emitting diode disposed on a side of the gate insulating layer away from the base substrate, the micro light emitting diode including a first electrode, a light emitting layer and a second electrode; and a common electrode. The second electrode of the thin film transistor is connected to one of the first and second electrodes of the micro light emitting diode. The other of the first and second
(Continued)

electrodes of the micro light emitting diode is connected to the common electrode.

19 Claims, 10 Drawing Sheets

(51) Int. Cl.
    *H01L 29/51*     (2006.01)
    *H01L 29/66*     (2006.01)
    *H01L 29/786*     (2006.01)
    *H01L 33/62*     (2010.01)

(52) U.S. Cl.
    CPC .. *H01L 29/66757* (2013.01); *H01L 29/66765* (2013.01); *H01L 29/78675* (2013.01); *H01L 29/78678* (2013.01); *H01L 33/62* (2013.01); *H01L 2933/0066* (2013.01)

(58) Field of Classification Search
    CPC ............ H01L 29/517; H01L 29/66757; H01L 29/66765; H01L 29/78675; H01L 29/78678; H01L 29/62; H01L 33/62; H01L 2933/0066; H01L 27/1214; H01L 21/84
    See application file for complete search history.

(56) References Cited

U.S. PATENT DOCUMENTS

| | | |
|---|---|---|
| 2012/0313076 A1 | 12/2012 | Nakamura |
| 2013/0313076 A1 | 11/2013 | Stelter et al. |
| 2016/0336374 A1* | 11/2016 | Jiang ................... H01L 27/1222 |
| 2017/0179092 A1 | 6/2017 | Sasaki |
| 2017/0186828 A1* | 6/2017 | Hsin ................... H01L 27/1225 |
| 2017/0278894 A1 | 9/2017 | Sato et al. |
| 2017/0294451 A1* | 10/2017 | Kim ....................... H01L 27/124 |
| 2018/0122836 A1* | 5/2018 | Kang .................... H01L 33/502 |
| 2018/0130910 A1* | 5/2018 | Yoshitani ............ H01L 27/1255 |
| 2019/0074324 A1* | 3/2019 | Kim .................... H01L 27/1248 |

FOREIGN PATENT DOCUMENTS

| | | | |
|---|---|---|---|
| CN | 106816512 A | | 6/2017 |
| CN | 107742636 A | | 2/2018 |
| WO | 2016051992 A1 | | 4/2016 |
| WO | WO-2016200882 A1 * | 12/2016 | ........... H01L 27/156 |

OTHER PUBLICATIONS

Office action from Chinese Application No. 201810220239.8 dated Jan. 6, 2021.

* cited by examiner

ARRAY SUBSTRATE, METHOD OF MANUFACTURING THE SAME, AND DISPLAY DEVICE

CROSS-REFERENCE TO RELATED APPLICATIONS

This application is the U.S. national phase entry of PCT/CN2018/115793, with an international filing date of Nov. 16, 2018, which claims the benefit of Chinese Patent Application No. 201810220239.8 filed on Mar. 16, 2018, the entire disclosures of which are incorporated herein by reference.

TECHNICAL FIELD

The present application relates to the field of display technologies, and in particular, to an array substrate, a method of manufacturing the array substrate, and a display device.

BACKGROUND

A micro light-emitting diode (micro LED) is a light-emitting device using an inorganic material such as gallium nitride as a light-emitting material, and typically has a size in the range of, for example, 10 μm to 15 μm. The display device using the micro LED as the light-emitting device has the advantages such as high brightness, fast response, and high stability.

In the manufacture of a micro LED display device, thin film transistors are generally formed that are arranged in an array on a glass substrate, and a plurality of micro LEDs are formed on a separate monocrystalline silicon substrate. Then, the monocrystalline silicon substrate is diced to individual multiple micro LEDs. Finally, the individual micro LEDs are transferred to respective areas on the array substrate.

SUMMARY

In accordance with an exemplary embodiment of the present disclosure, an array substrate is provided, comprising: a base substrate; a thin film transistor disposed on the base substrate, the thin film transistor comprising a gate electrode connected to a gate line, an active layer, a gate insulating layer insulating the gate electrode from the active layer, a first electrode connected to a data line, and a second electrode spaced apart from the first electrode; a micro light emitting diode disposed on a side of the gate insulating layer away from the base substrate, the micro light emitting diode comprising a first electrode, a light emitting layer and a second electrode; and a common electrode. The second electrode of the thin film transistor is connected to one of the first and second electrodes of the micro light emitting diode. The other of the first and second electrodes of the micro light emitting diode is connected to the common electrode.

In some embodiments, the micro light emitting diode further comprises: a first semiconductor layer disposed on a side of the light emitting layer closer to the base substrate, and a second semiconductor layer disposed between the light emitting layer and the second electrode. The first semiconductor layer is in contact with the first electrode of the micro light emitting diode.

In some embodiments, the micro light emitting diode further comprises a buffer layer disposed between the first semiconductor layer and the gate insulating layer, and the buffer layer and the first electrode of the micro light emitting diode are located on the side of the gate insulating layer away from the base substrate.

In some embodiments, the gate insulating layer is made of a metal oxide material comprising at least one selected from a group consisting of aluminum oxide, iron oxide, chromium oxide, titanium trioxide, vanadium oxide, ferrous titanate, magnesium titanate, lanthanum oxide, cerous oxide, gallium oxide, scandium oxide, samarium oxide, europium oxide, terbium oxide, dysprosium oxide, yttrium oxide, holimium oxide, thulium oxide, lutetium oxide, and neodymium oxide.

In some embodiments, the thin film transistor is of a structure selected from a group consisting of a top gate structure in which the gate electrode is in a same layer as and spaced apart from the first electrode of the micro light emitting diode, and a bottom gate structure in which the second electrode of the thin film transistor forms an integral structure with the first electrode of the micro light emitting diode or is connected to the second electrode of the micro light emitting diode.

In some embodiments, the thin film transistor is of the top gate structure. The array substrate further comprises an interlayer dielectric layer disposed on a side of the gate electrode away from the base substrate. The gate insulating layer is disposed on a side of the gate electrode closer to the base substrate. The active layer is disposed on a side of the gate insulating layer closer to the base substrate. The first and second electrodes of the thin film transistor are disposed on a side of the interlayer dielectric layer away from the base substrate, the first electrode of the thin film transistor is connected to the active layer through a first via disposed in the interlayer dielectric layer, and the second electrode of the thin film transistor is connected to the active layer through a second via disposed in the interlayer dielectric layer.

In some embodiments, the second electrode of the thin film transistor is connected to the first electrode of the micro light emitting diode through a first contact via disposed in the interlayer dielectric layer, and the second electrode of the micro light emitting diode is connected to the common electrode.

In some embodiments, the second electrode of the thin film transistor is in contact with the second electrode of the micro light emitting diode, and the first electrode of the micro light emitting diode is connected to the common electrode.

In some embodiments, the thin film transistor is of the bottom gate structure in which the second electrode of the thin film transistor forms the integral structure with the first electrode of the micro light emitting diode, one end of the integral structure is in contact with the active layer to form the second electrode of the thin film transistor, and the other end of the integral structure forms the first electrode of the micro light emitting diode.

In some embodiments, the thin film transistor is of the bottom gate structure in which the second electrode of the thin film transistor forms the integral structure with the first electrode of the micro light emitting diode. The array substrate further comprises a protective layer disposed on a side of the active layer away from the base substrate. The first electrode of the thin film transistor and the integral structure are disposed on a side of the protective layer away from the substrate. The first electrode of the thin film transistor is connected to the active layer through a third via disposed in the protective layer, one end of the integral structure is connected to the active layer through a fourth via disposed in the protective layer to form the second electrode of the thin film transistor, and the other end of the integral structure forms the first electrode of the micro light emitting diode.

In some embodiments, the common electrode is disposed in a same layer as the first electrode of the micro light emitting diode. In a case where the second electrode of the thin film transistor is connected to the first electrode of the micro light emitting diode, the first electrode of the micro light emitting diode is spaced apart from the common electrode, the second electrode of the micro light emitting diode is in contact with a connection electrode, and the connection electrode is connected to the common electrode through a third contact via. In a case where the second electrode of the thin film transistor is connected to the second electrode of the micro light emitting diode, the first electrode of the micro light emitting diode forms an integral structure with the common electrode.

In some embodiments, the common electrode is disposed on a side of the second electrode of the micro light emitting diode away from the base substrate, and the array substrate further comprises an insulating layer disposed between the common electrode and the second electrode. In a case where the second electrode of the thin film transistor is connected to the first electrode of the micro light emitting diode, the common electrode is connected to the second electrode of the micro light emitting diode through a fourth contact via disposed in the insulating layer. In a case where the second electrode of the thin film transistor is connected to the second electrode of the micro light emitting diode, the common electrode is connected to the first electrode of the micro light emitting diode through a fifth contact via extending through the insulating layer.

According to another exemplary embodiment of the present disclosure, a method of manufacturing an array substrate is provided, comprising: forming a thin film transistor on a base substrate, and a micro light emitting diode on a side of a gate insulating layer, away from the base substrate, of the thin film transistor, wherein the thin film transistor comprises a gate electrode connected to a gate line, an active layer, the gate insulating layer insulating the gate electrode from the active layer, a first electrode connected to a data line, and a second electrode spaced apart from the first electrode, and wherein the micro light emitting diode comprises a first electrode, a light emitting layer, and a second electrode; connecting the second electrode of the thin film transistor to one of the first and second electrodes of the micro light emitting diode; and connecting the other of the first and second electrodes of the micro light emitting diode to a common electrode.

In some embodiments, the forming the micro light emitting diode comprises: sequentially forming a first semiconductor layer, the light emitting layer, and a second semiconductor layer on a side of the gate insulating layer away from the substrate; forming the first electrode of the micro light emitting diode, which is in contact with the first semiconductor layer, on the side of the gate insulating layer away from the base substrate; and forming the second electrode of the micro light emitting diode on a side of the second semiconductor layer away from the base substrate.

In some embodiments, prior to the forming the first semiconductor layer, the method further comprises: forming a buffer layer on the side of the gate insulating layer away from the base substrate. The first semiconductor layer is formed on a side of the buffer layer away from the base substrate, and is in contact with the first electrode of the micro light emitting diode.

In some embodiments, the thin film transistor is of a top gate structure in which the gate electrode is in a same layer as and spaced apart from the first electrode of the micro light emitting diode. The forming the thin film transistor comprises: forming the active layer on the base substrate; forming the gate insulating layer on a side of the active layer away from the base substrate; forming the gate electrode on a side of the gate insulating layer away from the base substrate; forming an interlayer dielectric layer on a side of the gate electrode away from the base substrate; forming, on the base substrate, a first via and a second via extending through the interlayer dielectric layer and the gate insulating layer; and forming the first and second electrodes of the thin film transistor on a side of the interlayer dielectric layer away from the base substrate. The first electrode of the thin film transistor is connected to the active layer through the first via, and the second electrode of the thin film transistor is connected to the active layer through the second via.

In some embodiments, prior to the forming the first and second electrodes of the thin film transistor, the method further comprises forming a first contact via in the interlayer dielectric layer to expose the first electrode. The second electrode of the thin film transistor is connected to the first electrode of the micro light emitting diode through the first contact via, and the second electrode of the micro light emitting diode is connected to the common electrode.

In some embodiments, the thin film transistor is of a bottom gate structure in which the second electrode of the thin film transistor forms an integral structure with the first electrode of the micro light emitting diode. The forming the thin film transistor comprises: sequentially forming, on the base substrate, the gate electrode, the gate insulating layer, and the active layer of the thin film transistor; and forming the first electrode of the thin film transistor and the integral structure on the base substrate. One end of the integral structure is in contact with the active layer to form the second electrode of the thin film transistor, and the other end of the integral structure forms the first electrode of the micro light emitting diode.

In some embodiments, the thin film transistor is of a bottom gate structure in which the second electrode of the thin film transistor forms an integral structure with the first electrode of the micro light emitting diode. The forming the thin film transistor comprises: forming, on the base substrate, the gate electrode, the gate insulating layer and the active layer of the thin film transistor; forming a protective layer on a side of the active layer away from the base substrate; forming, in the protective layer, a third via and a fourth via for exposing the active layer, and a second contact via for exposing a first semiconductor layer of the micro light emitting diode; and forming the first electrode of the thin film transistor and the integrated structure on a side of the protective layer away from the base substrate. The first electrode of the thin film transistor is connected to the active layer through the third via, one end of the integral structure is connected to the active layer through the fourth via to form the second electrode of the thin film transistor, and the other end of the integrated structure is connected to the first semiconductor layer through the second contact via to form the first electrode of the micro light emitting diode.

In some embodiments, the forming the micro light emitting diode comprises forming the common electrode and the first electrode of the micro light emitting diode in a same layer by a one-time patterning process. After the forming the second electrode of the micro light emitting diode, the method further comprises: forming a third contact via to expose the common electrode; and forming a connection electrode which connects the second electrode of the micro light emitting diode to the common electrode through the third contact via.

In some embodiments, the method further comprises forming an insulating layer on a side of the second electrode of the micro light emitting diode away from the base substrate. In a case where the second electrode of the thin film transistor is connected to the first electrode of the micro light emitting diode, the method further comprises: forming a fourth contact via in the insulating layer to expose the second electrode of the micro light emitting diode; and forming the common electrode on the insulating layer, wherein the common electrode is connected to the second electrode through the fourth contact via. In a case where the second electrode of the thin film transistor is connected to the second electrode of the micro light emitting diode, the method further comprises: forming a fifth contact via to expose the first electrode; and forming the common electrode on the insulating layer, wherein the common electrode is connected to the first electrode through the fifth contact via.

According to yet another exemplary embodiment of the present disclosure, a display device is provided comprising the array substrate as described above.

DETAILED DESCRIPTION

Figure 1:
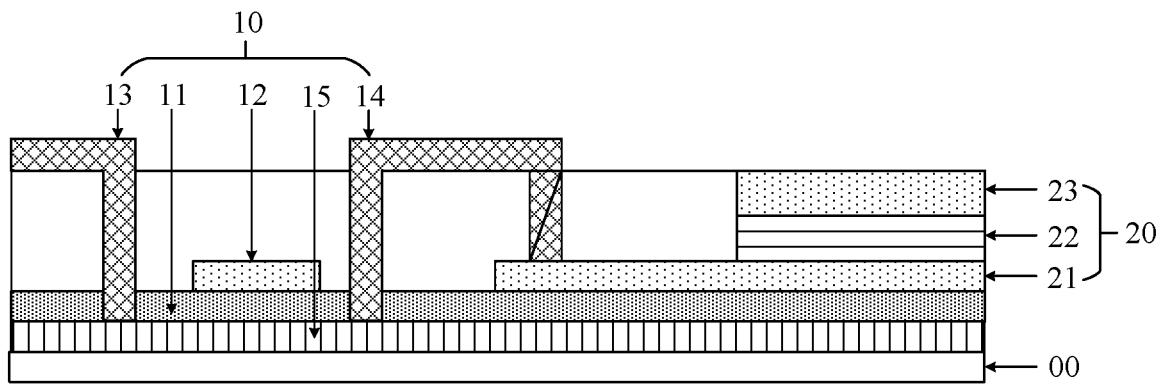
FIG. 1 is a schematic cross-sectional view of a structure of an array substrate according to an embodiment of the present disclosure.

In order to render the objectives, the technical solutions and the advantages more clear, embodiments of the present disclosure will be further described in detail below with reference to the accompanying drawings.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a schematic cross-sectional view of a structure of an array substrate according to an embodiment of the present disclosure. The array substrate may include a plurality of pixels arranged in an array, although only a single pixel is shown for convenience of illustration.

Referring to FIG. 1, the pixel includes a thin film transistor 10 disposed on a base substrate 00. The thin film transistor 10 includes a gate electrode 12 connected to a gate line (not shown in FIG. 1), an active layer 15, a gate insulating layer 11 that insulates the gate electrode from the active layer 15, a first electrode 13 connected to a data line (not shown in FIG. 1), and a second electrode 14 spaced apart from the first electrode 13.

The pixel further includes a micro LED 20 disposed on a side of the gate insulating layer 11 away from the base substrate 00. The micro LED 20 includes a first electrode 21, a light emitting layer 22, and a second electrode 23. In this embodiment, the second electrode 14 of the thin film transistor 10 is connected to the first electrode 21, and the second electrode 23 is connected to a common electrode (not shown in FIG. 1) configured to receive a common voltage. In other embodiments, the second electrode 14 of the thin film transistor 10 may be connected to the second electrode 23, and the first electrode 21 may be connected to the common electrode. An electrode (the first electrode 21 in this example) of the micro LED 20, which is connected to the second electrode 14 of the thin film transistor 10, may be referred to as an anode, and an electrode (the second electrode 23 in this example) of the micro LED 20, which is connected to the common electrode, may be referred to as a cathode.

The thin film transistor 10 is used to drive the micro LED 20 to emit light. The first electrode 13 can be a source and the second electrode 14 can be a drain. Alternatively, the first electrode 13 can be a drain and the second electrode 14 can be a source. The first electrode 21 may be an N-type electrode, and the second electrode 23 may be a P-type electrode. In some examples, the micro LEDs of the individual pixels may share an anode, i.e., the anodes of the micro LEDs of the individual pixels may be the same electrode.

The light emitting layer 22 in the micro LED 20 may be formed of a material of a group III-V compound (including a binary compound, a ternary compound, or a quaternary compound, etc.). The group III-V compound refers to a compound formed of group III elements and group V elements in the periodic table of elements, with the group III elements including boron (B), aluminum (Al), gallium (Ga), indium (In), etc., and the group V elements including nitrogen (N), phosphorus (P), arsenic (As), antimony (Sb), etc. The group III-V compound generally includes gallium arsenide (GaAs), indium phosphide (InP), gallium nitride (GaN), etc. The semiconductor light emitting layer formed of the group III-V compound material has high luminous efficiency, good stability, and long life.

In operation, the voltage applied to the common electrode of the array substrate may be different from the common electrode voltage of a conventional display device. For example, the common electrode voltage in the conventional display device may be 0 volt (V), or near 0 V, for example, −5 V to 5 V; whereas in the array substrate of the embodiment of the present disclosure, the voltage applied to the common electrode may not be limited to the above range. Depending on the operational requirements of the micro LED (luminous brightness requirement or luminous efficiency requirement), the cathode voltage applied to the common electrode ranges from −20 V to 20 V, typically not equal to 0 V.

Figure 2A:
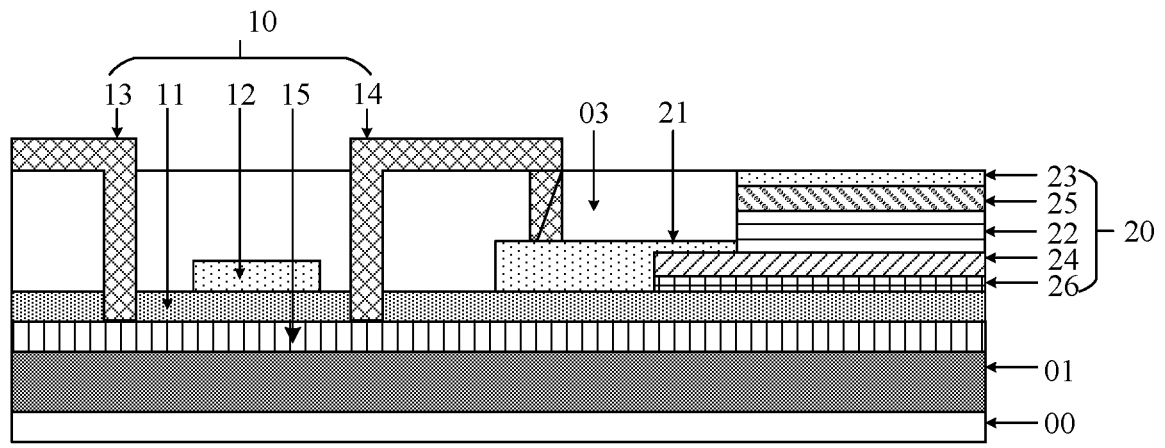
FIG. 2A is a schematic cross-sectional view of a structure of an array substrate according to another embodiment of the present disclosure.

FIG. 2A is a schematic cross-sectional view of a structure of an array substrate according to another embodiment of the present disclosure. The same elements as in FIG. 1 are denoted by the same reference signs and will not be described in detail herein.

Referring to FIG. 2A, the micro LED 20 further includes a first semiconductor layer 24 disposed on a side of the light emitting layer 22 closer to the base substrate 00, and a second semiconductor layer 25 disposed between the light emitting layer 22 and the second electrode 23. The first electrode 21 is in contact with the first semiconductor layer 24. In this example, the second semiconductor layer 25 in contact with the second electrode 23 (the cathode) may be an N-type semiconductor layer, and the first semiconductor layer 24 in contact with the first electrode 21 (the anode) may be a P-type semiconductor layer. The N-type semiconductor layer may be made of a group III-V compound material doped with a group IV element, for example, a GaN material doped with silicon (Si) atoms. The P-type semiconductor layer may be made of a group III-V compound material doped with a group II element, for example, a GaN material doped with magnesium (Mg) atoms.

With continued reference to FIG. 2A, the micro LED 20 further includes a buffer layer 26 disposed between the first semiconductor layer 24 and the gate insulating layer 11. Both the first electrode 21 and the buffer 26 layer are located on a side of the gate insulating layer 11 away from the base substrate 00. In the example of FIG. 2A, the buffer layer 26 and the first semiconductor layer 24 have protrusions with respect to other film layers in the micro LED 20, and the first electrode 21 covers the protrusion of the first semiconductor layer 24, thereby achieving effective contact with the first semiconductor layer 24.

By way of example and not limitation, the gate insulating layer 11 may be made of a metal oxide material including any one of aluminum oxide ($Al_2O_3$), iron oxide ($Fe_2O_3$), chromium oxide ($Cr_2O_3$), and titanium trioxide ($Ti_2O_3$), vanadium oxide ($V_2O_3$), ferrous titanate ($FeTiO_3$), magnesium titanate ($MgTiO_3$), lanthanum oxide ($La_2O_3$), cerous oxide ($Ce_2O_3$), gallium oxide ($Ga_2O_3$), scandium oxide ($Sc_2O_3$)), samarium oxide ($Sm_2O_3$), europium oxide ($Eu_2O_3$), terbium oxide ($Tb_2O_3$), dysprosium oxide ($Dy_2O_3$), yttrium oxide ($Y_2O_3$), holimium oxide ($Ho_2O_3$), thulium oxide ($Tm_2O_3$), lutetium oxide ($Lu_2O_3$), and neodymium oxide ($Nd_2O_3$), or combination thereof. The buffer layer 26 may be formed of a material such as GaN, GaAs, or InP.

In addition, as shown in FIG. 2A, a base buffer layer 01 may be disposed on the base substrate 00. Both the thin film transistor 10 and the micro LED 20 are disposed on a side of the base buffer layer 01 away from the base substrate 00. The base buffer layer 01 may be a composite film structure composed of a film of silicon nitride (SiN) and a film of silicon dioxide ($SiO_2$).

Figure 2B:
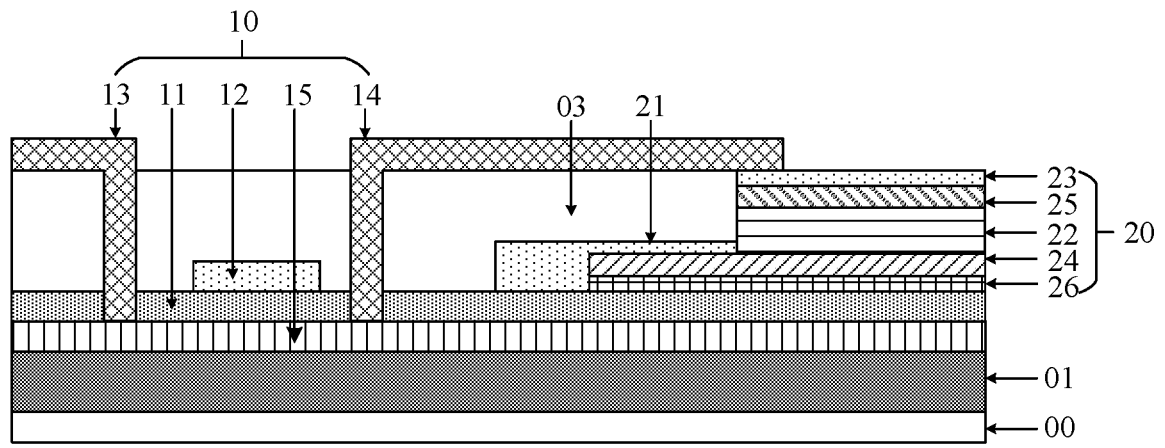
FIG. 2B is a schematic cross-sectional view of a structure of an array substrate according to still another embodiment of the present disclosure.

FIG. 2B is a schematic cross-sectional view of a structure of an array substrate according to still another embodiment of the present disclosure. The same elements as in FIG. 2A are denoted by the same reference signs and will not be described in detail herein.

Referring to FIG. 2B, the second electrode 14 of the thin film transistor 10 is in direct contact with the second electrode 23 of the micro LED 20. In this example, a side of the second electrode 14 closer to the base substrate 00 is in contact with a side of the second electrode 23 away from the base substrate 00. In addition, the first electrode 21 may be connected to a common electrode (not shown in FIG. 2B).

In the example of FIGS. 2A and 2B, the thin film transistor 10 is of a top gate structure in which the gate insulating layer 11 is disposed on a side of the gate electrode 12 closer to the base substrate 00, and the active layer 15 is disposed on a side of the gate insulating layer 11 closer to the base substrate 00. The first electrode 21 of the micro LED 20 is disposed in the same layer as and spaced apart from the gate electrode 12. In addition, an interlayer dielectric layer 03 is further disposed on a side of the gate electrode 12 away from the base substrate 00, and the first electrode 13 and the second electrode 14 of the thin film transistor 10 are disposed, spatially spaced apart from each other, on a side of the interlayer dielectric layer 03 away from the base substrate 00.

Figure 2C:
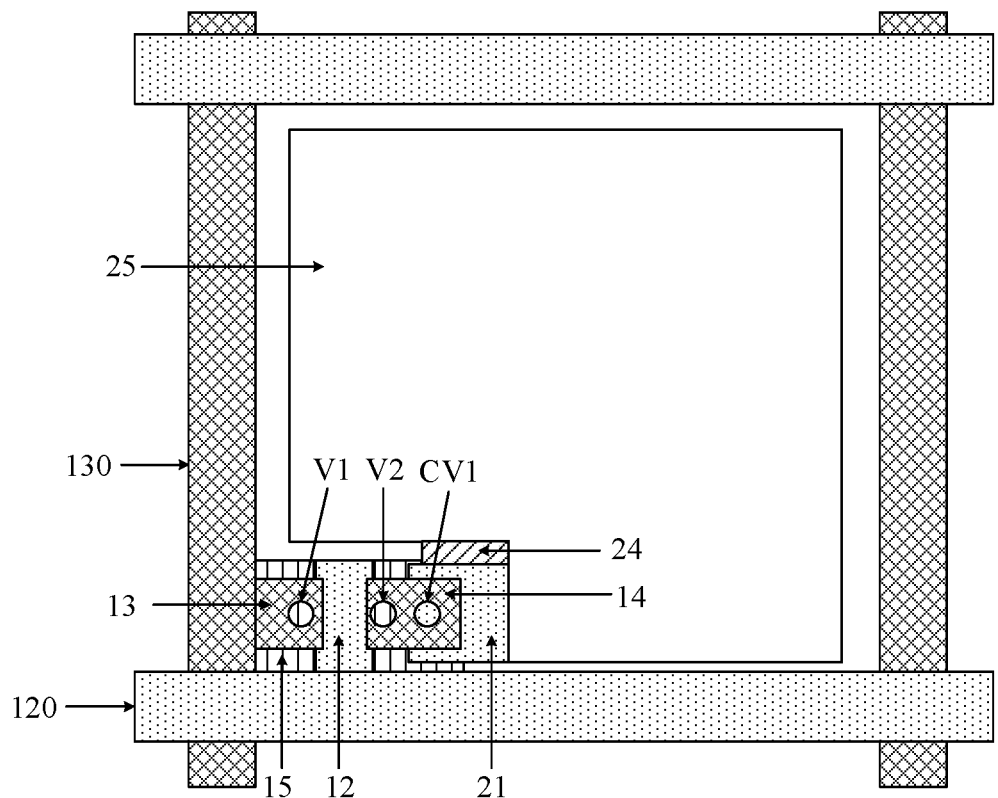
FIG. 2C is a schematic plan view of the structure of the array substrate of FIG. 2A.

FIG. 2C is a plan view of the structure shown in FIG. 2A. Referring to FIGS. 2A and 2C, the first electrode 13 is connected to the active layer 15 through a first via V1, the second electrode 14 is connected to the active layer 15 through a second via V2, and the second electrode 14 is connected to the first electrode 21 through a first contact via CV1. Further, the first electrode 13 of the thin film transistor is connected to a data line 130, and the gate electrode 12 of the thin film transistor is connected to a gate line 120, as can be seen from FIG. 2C.

Figure 3A:
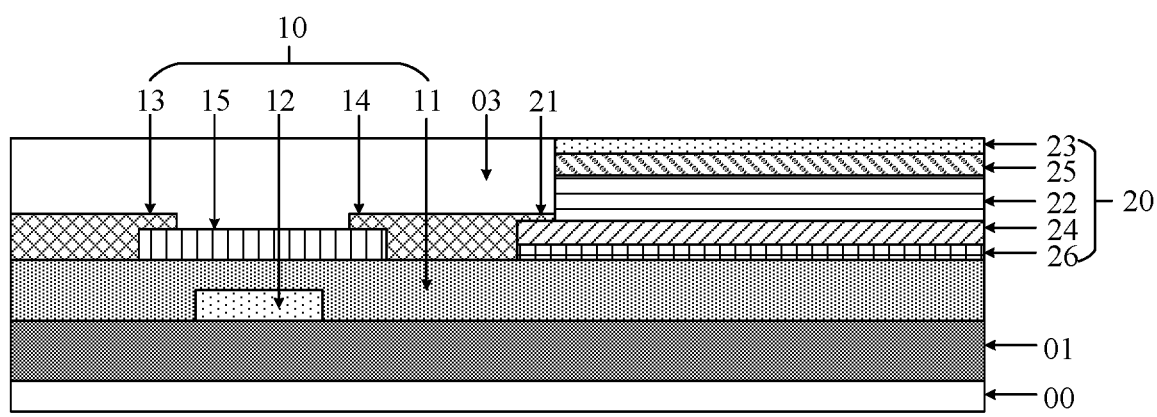
FIG. 3A is a schematic cross-sectional view of a structure of an array substrate according to still another embodiment of the present disclosure.

FIG. 3A is a schematic cross-sectional view of a structure of an array substrate according to still another embodiment of the present disclosure.

As shown in FIG. 3A, the thin film transistor 10 is of a bottom gate structure, and the first electrode 21 of the micro LED 20 forms an integral structure with the second electrode 14 of the thin film transistor 10. A portion of the integral structure that is in contact with the active region 15 forms the second electrode 14 of the thin film transistor 10, and a portion of the integral structure that is in contact with the first semiconductor layer 24 forms the first electrode 21 of the micro LED 20. The second electrode 23 of the micro LED 20 is connected to a common electrode (not shown).

For the thin film transistor 10 of the bottom gate structure, the gate insulating layer 11 is disposed on a side of the gate electrode 12 away from the base substrate 00, the active layer 15 is disposed on a side of the gate insulating layer 11 away from the base substrate 00, and the first electrode 13 of the thin film transistor 10 and the integral structure are disposed on a side of the gate insulating layer 11 away from the base substrate 00 and both are in contact with the active layer 15.

In the micro LED 20, the first semiconductor layer 24 and the buffer layer 26 have protrusions with respect to other film layers of the micro LED 20. One end of the integral structure covers the protrusion of the first semiconductor layer 24, thereby achieving effective contact with the first semiconductor layer 24.

Figure 3B:
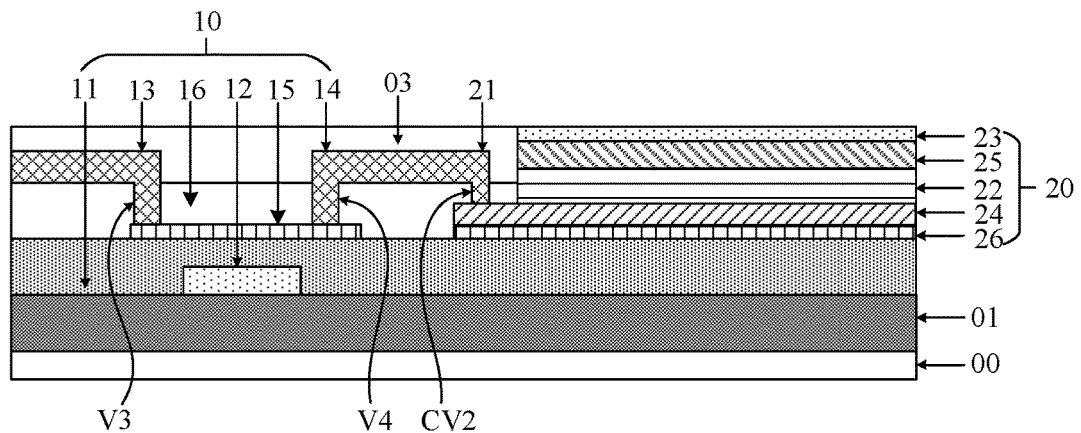
FIG. 3B is a schematic cross-sectional view of a structure of an array substrate according to still another embodiment of the present disclosure.

FIG. 3B is a schematic cross-sectional view of a structure of an array substrate according to still another embodiment of the present disclosure. The same elements as in FIG. 3A are denoted by the same reference signs and will not be described in detail herein.

As shown in FIG. 3B, a protective layer 16 is further disposed on a side of the active layer 15 away from the base substrate 00. The first electrode 13 of the thin film transistor 10 and the integral structure of the second electrode 14 and the first electrode 21 are disposed on a side of the protective layer 16 away from the base substrate 00. The first electrode 13 is connected to the active layer 15 through a third via V3. One end of the integral structure is connected to the active layer 15 through the fourth via V4 to form the second electrode 14 of the thin film transistor 10. The other end of the integral structure is connected to the first semiconductor layer 24 through a second contact via CV2 to form the first electrode 21 of the micro LED 20.

To facilitate the connection of the integral structure to the first semiconductor layer 24, as shown in FIG. 3B, the first semiconductor layer 24 has a protrusion with respect to the light emitting layer 22 and the second semiconductor layer 25, such that the integrated structure can be in contact with the protrusion of the first semiconductor layer 24.

Figure 3C:
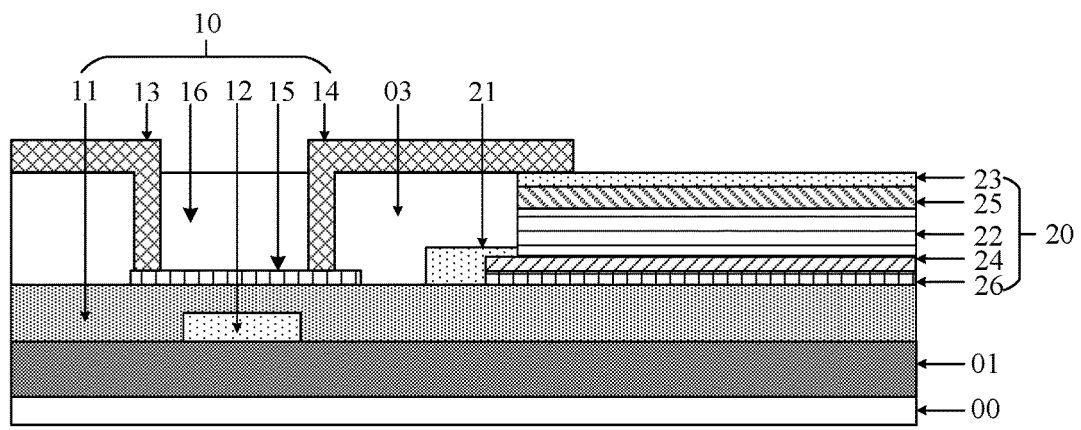
FIG. 3C is a schematic cross-sectional view of a structure of an array substrate according to still another embodiment of the present disclosure.

FIG. 3C is a schematic cross-sectional view of a structure of an array substrate according to still another embodiment of the present disclosure. The same elements as in FIG. 3A are denoted by the same reference signs and will not be described in detail herein.

As shown in FIG. 3C, the second electrode 14 of the thin film transistor 10 is in direct contact with the second electrode 23 of the micro LED 20. In this example, a side of the second electrode 14 closer to the base substrate 00 is in contact with a side of the second electrode 23 away from the base substrate 00. The first electrode 21 of the micro LED 20 may be connected to a common electrode (not shown).

Figure 4A:
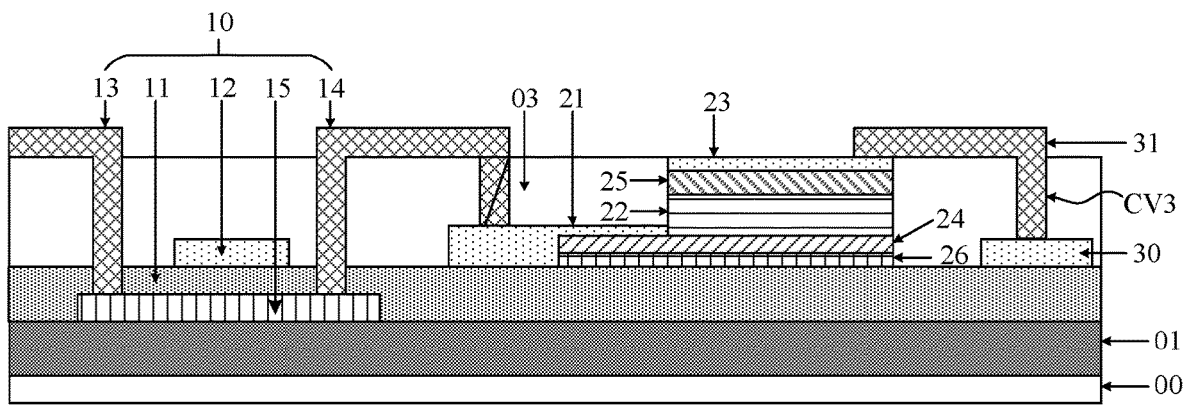
FIG. 4A is a schematic cross-sectional view of a structure of an array substrate according to still another embodiment of the present disclosure.

FIG. 4A is a schematic cross-sectional view of a structure of an array substrate according to still another embodiment of the present disclosure. The same elements as in FIG. 2A are denoted by the same reference signs and will not be described in detail herein.

As shown in FIG. 4A, the common electrode 30 is disposed in the same layer as the first electrode 21. The second electrode 14 of the thin film transistor 10 is connected to the first electrode 21 of the micro LED. A side of the second electrode 23 away from the base substrate 00 is further provided with a connection electrode 31 which is connected to a common electrode 30 through a third contact via CV3 provided in a interlayer dielectric layer 03. In this example, the connection electrode 31 is disposed in the same layer as the first electrode 13 and the second electrode 14, and thus can be formed by a one-time patterning process.

Figure 4B:
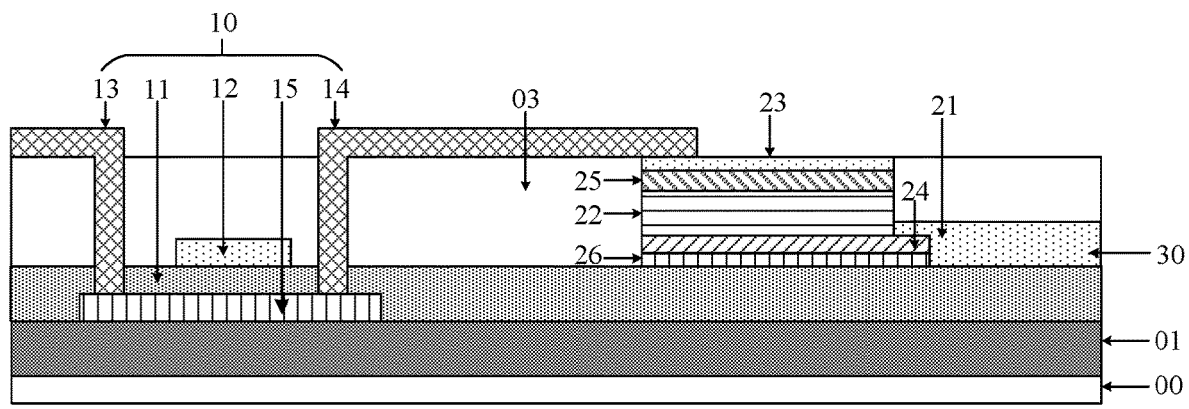
FIG. 4B is a schematic cross-sectional view of a structure of an array substrate according to still another embodiment of the present disclosure.

FIG. 4B is a schematic cross-sectional view of a structure of an array substrate according to still another embodiment of the present disclosure. The same elements as in FIG. 4A are denoted by the same reference signs and will not be described in detail herein.

As shown in FIG. 4B, the second electrode 14 of the thin film transistor 10 is directly connected to the second electrode 23 of the micro LED, and the common electrode 30 forms an integral structure with the first electrode 21 of the micro LED. The integral structure is in direct contact with the first semiconductor layer 24, and a portion of the integral structure that is in contact with the first semiconductor layer 24 forms the first electrode 21 of the micro LED 20.

Figure 5A:
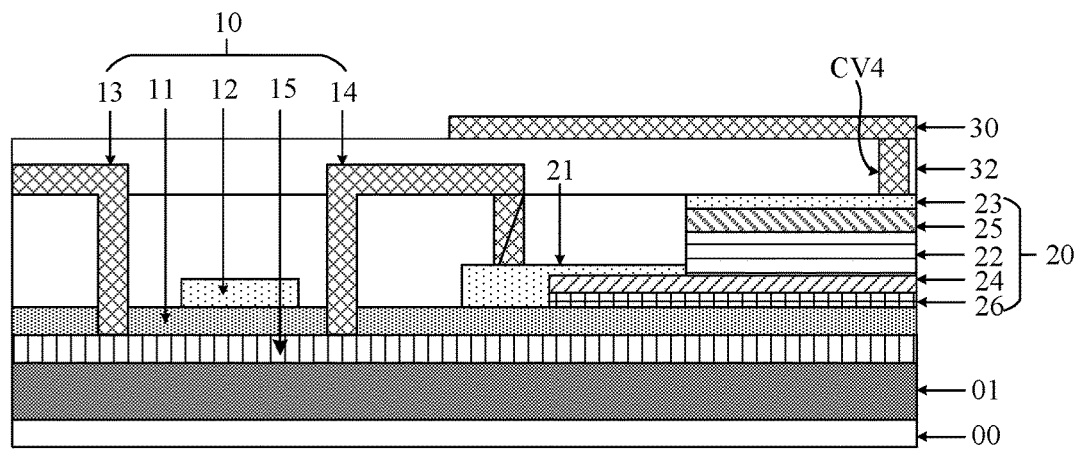
FIG. 5A is a schematic cross-sectional view of a structure of an array substrate according to still another embodiment of the present disclosure.

FIG. 5A is a schematic cross-sectional view of a structure of an array substrate according to still another embodiment of the present disclosure. The same elements as in FIG. 2A are denoted by the same reference signs and will not be described in detail herein.

As shown in FIG. 5A, the common electrode 30 is disposed on a side of the second electrode 23 away from the base substrate 00, and an insulating layer 32 is formed between the common electrode 30 and the second electrode 23. The second electrode 14 of the thin film transistor 10 is connected to the first electrode 21 of the micro LED 20, and the common electrode 30 is connected to the second electrode 23 of the micro LED 20 through a fourth contact via CV4 provided in the insulating layer 32. In this example, the active layer 15 in the thin film transistor 10 completely covers the base substrate.

Figure 5B:
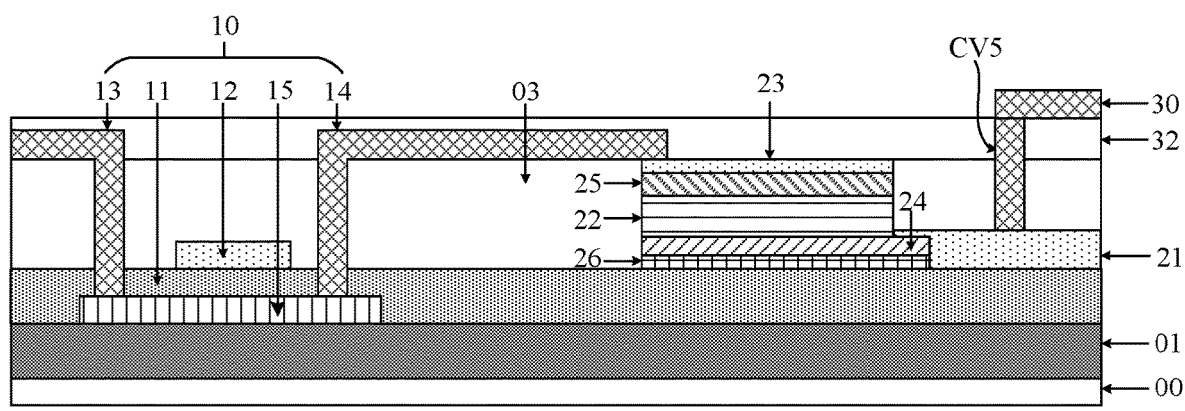
FIG. 5B is a schematic cross-sectional view of a structure of an array substrate according to still another embodiment of the present disclosure.

FIG. 5B is a schematic cross-sectional view of a structure of an array substrate according to still another embodiment of the present disclosure. The same elements as in FIG. 5A are denoted by the same reference signs and will not be described in detail herein. When the second electrode 14 of the thin film transistor 10 is connected to the second electrode 23, as shown in FIG. 5B, the common electrode 30 can be connected to the first electrode 21 through a fifth contact via CV5 disposed in the insulating layer 32 and in the interlayer dielectric layer 03. In this example, the active layer 15 is disposed only in the active region of the thin film transistor 10.

In embodiments, by providing the thin film transistor on the base substrate and providing the micro LED on the gate insulating layer of the thin film transistor, the micro LED can be formed simultaneously in the process of forming the thin film transistor, simplifying the manufacturing process of the array substrate and reducing the manufacturing cost of the display device.

Figure 6:
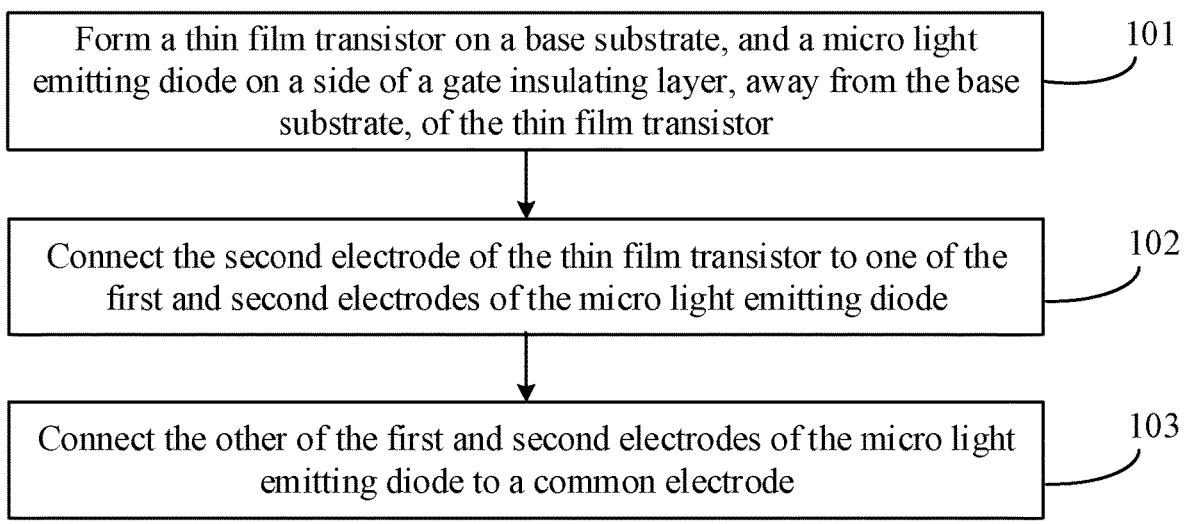
FIG. 6 is a flow chart of a method of manufacturing an array substrate according to an embodiment of the present disclosure.

FIG. 6 is a flow chart of a method of manufacturing an array substrate according to an embodiment of the present disclosure. The method can be used to manufacture the array substrate shown in any of FIGS. 1 to 5B.

At step 101, a thin film transistor is formed on a base substrate, and a micro light emitting diode (LED) is formed on a side of a gate insulating layer, which is away from the base substrate, of the thin film transistor. The thin film transistor includes a gate electrode connected to a gate line, an active layer, the gate insulating layer that insulates the gate electrode from the active layer, a first electrode connected to a data line, and a second electrode spaced apart from the first electrode. The micro LED includes a first electrode, a light emitting layer, and a second electrode. At step 102, the second electrode of the thin film transistor is connected to one of the first and second electrodes of the micro light emitting diode. At step 103, the other of the first and second electrodes of the micro light emitting diode is connected to a common electrode. It will be understood that steps 101 through 103 may be an integral process although they are illustrated in FIG. 6 as being separate from each other.

By forming the thin film transistor on the base substrate and forming the micro LED on the gate insulating layer of the thin film transistor, the thin film transistor and the micro LED can be simultaneously formed in the manufacturing process, thereby effectively simplifying the manufacturing process of the array substrate and reducing the manufacturing cost of the display device. Advantageously, the manufacturing method provided by embodiments of the present disclosure consumes shorter process time and has higher yields as compared with conventional transfer processes.

In general, in the above step 101, the process of forming the micro LED may include: sequentially forming a first semiconductor layer, a light emitting layer, and a second semiconductor layer on a side of the gate insulating layer away from the base substrate; and then forming a first electrode in contact with the first semiconductor layer on a side of the gate insulating layer away from the base substrate, and forming a second electrode on a side of the second semiconductor layer away from the base substrate. The manufacturing method may further include forming a buffer layer on a side of the gate insulating layer away from the base substrate before forming the first semiconductor layer. The first semiconductor layer may be formed on a side of the buffer layer away from the base substrate, and the first semiconductor layer may have a protrusion with respect to other film layers of the micro LED. The subsequently formed first electrode may overlie the protrusion of the first semiconductor layer to ensure effective contact with the first semiconductor layer.

The manufacturing method of the array substrate provided by embodiments of the present disclosure is described in detail below, taking the array substrate of the thin film transistor having the top gate structure shown in FIGS. 2A, 2B, 4A and 4B as an example.

Figure 7A:
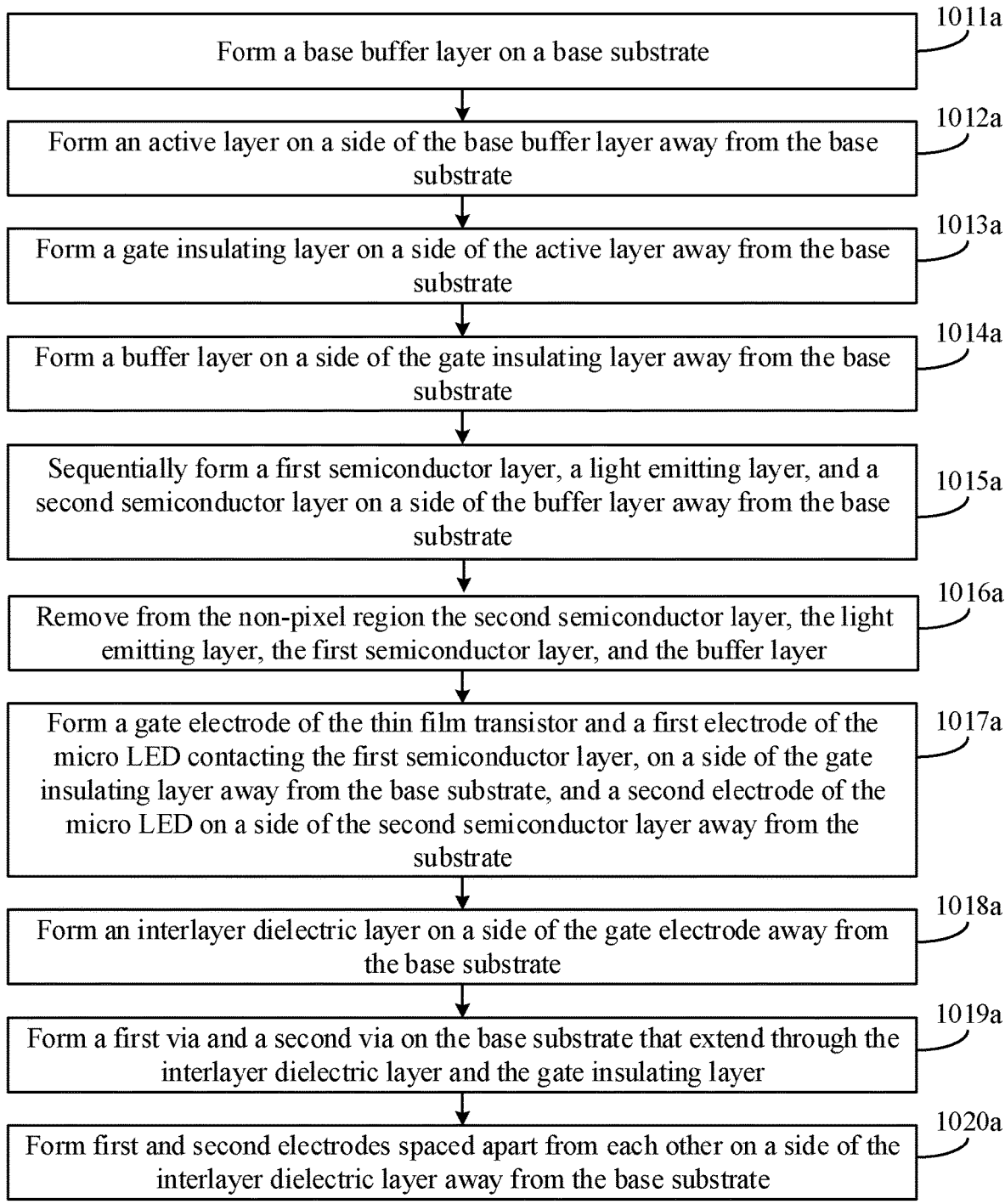
FIG. 7A is a flowchart of a method of manufacturing an array substrate according to another embodiment of the present disclosure.

Referring to FIG. 7A, the method may include the following steps.

At step 1011a, a base buffer layer is formed on a base substrate. The base substrate may be a glass substrate. The base buffer layer may be a composite film structure composed of a film of silicon nitride (SiN) and a film of silicon dioxide ($SiO_2$).

In an embodiment, when the base buffer layer is formed, the base substrate may be initially cleaned to remove impurity particles on the surface of the base substrate, and then the plasma enhanced chemical vapor deposition (PECVD) method is used to sequentially form a SiN film and a SiO$_2$ film on a surface of the base substrate, thereby obtaining the base buffer layer. The SiN film may have a thickness ranging from 50 nanometers (nm) to 100 nm, and the SiO2 film may have a thickness ranging from 100 nm to 400 nm. The SiN film has strong diffusion barrier property, and can inhibit the influence of metal ions in the glass substrate on the polysilicon film to be formed subsequently, and the SiO$_2$ film and the polysilicon film have an excellent interface, and can prevent the defects of the SiN film from damaging on the quality of the polysilicon film.

At step 1012a, an active layer is formed on a side of the base buffer layer away from the base substrate. The active layer may be formed on the surface of the base buffer layer using PECVD. The active layer may be formed of an amorphous silicon (a-Si) material, a polysilicon material, or indium gallium zinc oxide (IGZO).

Figure 7B:
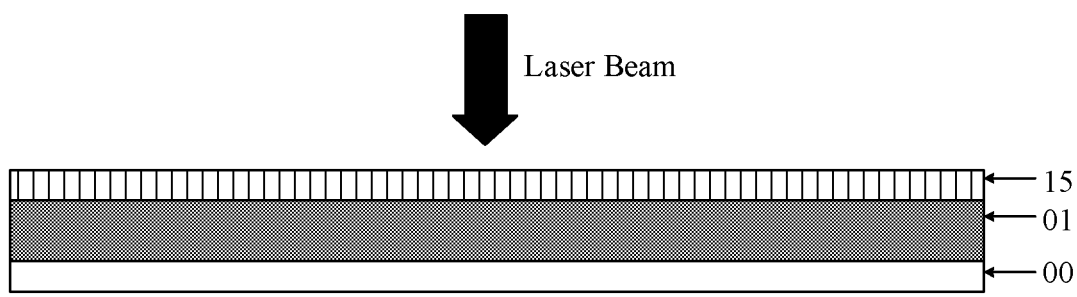
FIG. 7B is a schematic cross-sectional view showing a structure obtained by forming an active layer on a base substrate.

In an embodiment, when the active layer is formed, a layer of a-Si film having a thickness of 40 nm to 100 nm may be continuously deposited on the base buffer layer 01 by PECVD, and then the a-Si film may be dehydrogenated using a heat treatment furnace, in order to prevent hydrogen explosion during crystallization. An a-Si crystallization process can then be performed to form a polysilicon film. The a-Si film can usually be crystallized by laser annealing crystallization, metal induced crystallization or solid phase crystallization. For example, as shown in FIG. 7B, the a-Si film may be subjected to laser annealing crystallization using a laser beam. Further, the polysilicon film can be cleaned by using diluted hydrofluoric acid to reduce surface roughness of the polysilicon film and hence defects of the thin film transistor. Finally, ion implantation or ion cloud implantation may be used to perform channel doping of the thin film transistor on the polysilicon film to obtain the active layer. The doped ions in the channel doping are generally a mixed gas of phosphine (PH$_3$) and hydrogen (H$_2$), or a mixed gas of diborane (B$_2$H$_6$) and H$_2$. The dose for the ion implantation is between $10^{11}$ and $10^{13}$ ions/cm$^2$ (ions/cm$^2$ is the measurement unit of the negative ions concentration, which refers to the number of negative ions per square centimeter), and the implantation energy is between 10 and 100 kiloelectron volts (KeVs). The channel doping can effectively adjust the threshold voltage of the thin film transistor and improve the switching characteristics of the thin film transistor.

Figure 7C:
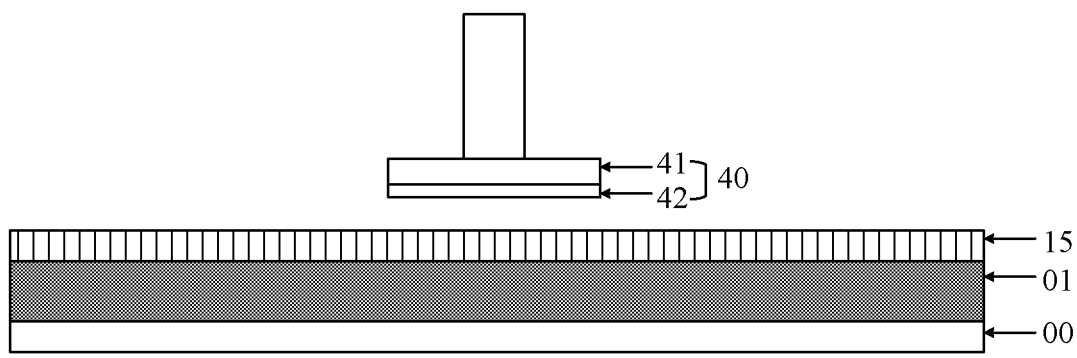
FIG. 7C is a schematic view showing polishing of the active layer of FIG. 7B.

In an embodiment, after the depositing of the polysilicon film, a sacrificial layer may also be deposited on the surface of the polysilicon film. For example, a layer of silicon nitride (SiN$_x$) may be deposited as the sacrificial layer. Further, as shown in FIG. 7C, the sacrificial layer and the polysilicon film may be ground using a chemical mechanical polishing apparatus 40 having a grinding disc 41 and a polishing pad 42. The grinding process may include two stages, wherein the first stage is for removing the sacrificial layer and the second stage is for simultaneously removing the polysilicon film and the residual sacrificial layer. Since the upper surface of the polysilicon film (i.e., the side away from the base substrate 00) is uneven (the thickness of the SiN$_x$ deposited on the recess of the surface of the polysilicon film being larger, and the thickness of the SiN$_x$ deposited on the surface of the polysilicon film being smaller), as the chemical mechanical polishing apparatus 40 is ground in this first stage, SiN$_x$ is continuously thinned, and part of the surface of the polysilicon film is exposed. Then proceed to the second stage, in which the SiN$_x$ and part of the surface of the polysilicon film are simultaneously exposed to the chemical mechanical polishing liquid and the mechanical polishing, and the polysilicon is preferentially etched and removed since the chemical mechanical polishing liquid has a stronger etching ability for the polysilicon. Thereby, the protrusion of the rough polysilicon surface can be smoothed. The chemical mechanical polishing liquid may be an alkaline silica polishing liquid.

In embodiments of the present disclosure, in addition to SiN$_x$, a silicon oxide (SiO$_x$) film may be deposited on the surface of the polysilicon film as the sacrificial layer. The SiO$_x$ film may have a thickness of 800 to 120 angstroms, for example, 90 to 110 angstroms. Alternatively, the SiO$_x$ film may be formed on the surface of the polysilicon film by a dry oxidation process in which oxygen may be introduced into a reaction chamber to cause oxidation of the polysilicon to SiO$_x$ at a high temperature. The temperature and time of the oxidation can be adjusted where appropriate. This process is relatively mature and easy to design. In addition, the SiO$_x$ film can also be deposited by chemical vapor deposition. For example, the SiO$_x$ film can be deposited by PECVD. The efficiency and cost control of the PECVD is relatively good. Those skilled in the art will appreciate that other well-known thin film deposition or epitaxial approaches can be used to form the SiO$_x$ film on the surface of the polysilicon film. The process of chemical mechanical polishing using a SiO$_x$ film as a sacrificial layer is similar to the process of chemical mechanical polishing using a SiN$_x$ film as a sacrificial layer, and the specific process thereof will not be described again.

Further, the surface of the polysilicon film may be wet-etched using an etching solution to remove residual sacrificial layer material on the surface of the polysilicon film, and residual particles generated by the chemical mechanical polishing process, thereby further reducing the roughness of the surface of the polysilicon film.

At step 1013a, a gate insulating layer is formed on a side of the active layer away from the base substrate. A metal oxide film may be formed on the surface of the active layer as the gate insulating layer by a magnetron sputtering process. For example, a layer of Al$_2$O$_3$ film may be formed as the gate insulating layer.

Figure 7D:
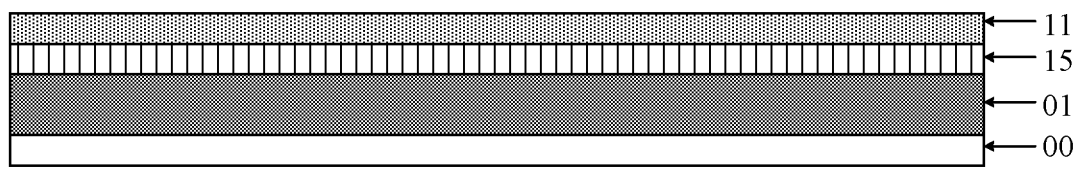
FIG. 7D is a schematic cross-sectional view showing a structure obtained by forming a gate insulating layer on the active layer of FIG. 7C.

In an embodiment, the chemically and mechanically polished polycrystalline silicon film may be cleaned by ultrasonic cleaning using acetone, ethanol, and deionized water prior to coating. Then, in the ultrahigh vacuum magnetron sputtering system, an aluminum oxide film can be deposited on the surface of the polished active layer by radio frequency reactive magnetron sputtering, obtaining a gate insulating layer 11 as shown in FIG. 7D. In the process of forming the aluminum oxide film, high purity (of 99.998%) argon (Ar) can be used as a sputtering gas, and high purity (of 99.995%) oxygen (O$_2$) as a reaction gas. These two gases are precisely controlled by a gas mass flow meter to pass into a vacuum chamber at different ratios. The total pressure of the mixed gas of Ar and O$_2$ in the vacuum chamber can be displayed by a vacuum gauge, and the total pressure can be controlled by a vacuum valve. The sputtering target is high purity (of 99.99%) Al, and an oxide layer is present on the surface of the high purity Al target. At the time of sputtering, pre-sputtering may be performed in pure Ar for 20 to 30 minutes to remove contaminants from the surface of the Al target. The sputtering parameters are a flow rate of 20 standard milliliters per minute (sccm) for the Ar gas, a working gas pressure of 2.0 Pascal (Pa), a sputtering power of 100 watts (W), and a temperature of 450 degrees Celsius for heating the base substrate. When the glow of the surface of the Al target gradually becomes brightened from being dusky and stabilizes, it can be confirmed that the surface has been cleaned.

The background vacuum before sputtering should be higher than $5×10^{-5}$ Pa, wherein the background vacuum means that the gas in a certain space is vacuumized to a certain degree of vacuum using a vacuum pumping system in the vacuum coating. After the current and voltage on the Al target surface are sufficiently stabilized, a sample baffle is turned away for formal sputtering. After the sputtering, the sample is annealed in situ under an oxygen atmosphere in the vacuum chamber. The working atmosphere has a pressure of 0.5 Pa, which is advantageous for crystallizing the deposited film to form a hexagonal crystal structure (corundum). Moreover, since a small cooling rate can generate a small internal stress, and oxygen can supplement the oxygen vacancy due to sputtering in the aluminum oxide film, the aluminum oxide film can be better attached with the substrate (i.e., the active layer).

In embodiments of the present disclosure, the gate insulating layer may be formed of a metal oxide material, which may, in addition to $Al_2O_3$, be any of $Fe_2O_3$, $Cr_2O_3$, $Ti_2O_3$, $V_2O_3$, $FeTiO_3$, $MgTiO_3$, $La_2O_3$, $Ce_2O_3$, $Ga_2O_3$, $Sc_2O_3$, $Sm_2O_3$, $Eu_2O_3$, $Tb_2O_3$, $Dy_2O_3$, $Y_2O_3$, $Ho_2O_3$, $Tm_2O_3$, $Lu_2O_3$, and $Nd_2O_3$.

At step 1014a, a buffer layer is formed on a side of the gate insulating layer away from the base substrate. Metal organic chemical vapor deposition (MOCVD) may be used to deposit a GaN film on the surface of the gate insulating layer as the buffer layer, which buffer layer may improve the epitaxial lattice quality of the semiconductor layer to be formed subsequently.

In an embodiment, in order to remove impurities such as oil stain adhered on the surface of the gate insulating layer in the base substrate, the base substrate on which the base buffer layer, the active layer and the gate insulating layer were formed may be rinsed for several times with absolute ethanol. Then, the base substrate is sequentially placed into acetone, absolute ethanol and deionized water for ultrasonic cleaning each for 10 minutes, then repeatedly rinsed with deionized water, and finally dried with high purity nitrogen ($N_2$). When the buffer layer is deposited by MOCVD, trimethylgallium (TMGa) can be used as a gallium source. With a TMGa bubbler placed in a cold trap to maintain its temperature at −12.6 degrees Celsius, $H_2$ used as a carrier gas, and high purity $N_2$ with a purity of 5N (i.e., 99.999%) as a nitrogen source, low temperature deposition is performed on the base substrate on which the gate insulating layer was formed (the deposition temperature less than 500 degrees Celsius). For example, with the microwave source power fixed at 650 W, and the background vacuum better than $5.0×10-4$ Pa, a GaN low temperature buffer layer having a thickness of about 20 nm is first deposited in an environment of 300 degrees Celsius. The deposition conditions are flow rates of 0.4 sccm and 80 sccm respectively for TMGa and nitrogen, and a deposition time of 5 min. Then, the temperature of the substrate is raised to 430 degrees Celsius, the flow rates of TMGa and nitrogen are 0.4 sccm and 80 sccm, respectively, and the deposition time is increased to 30 min.

It should be noted that, in addition to be formed using GaN, the buffer layer may be formed using a material such as GaAs or InP. This is advantageous for epitaxial growth since the material alumina for forming the gate insulating layer has the same crystal structure as that of the materials such as GaAs and GaN. Although the lattice constant and thermal expansion coefficient do not match the III-V semiconductor material for epitaxial growth, its cost is low and the light transmittance is up to 90%, which is suitable for the laser heating process.

At step 1015a, a first semiconductor layer, a light emitting layer, and a second semiconductor layer are sequentially formed on a side of the buffer layer away from the base substrate. The first semiconductor layer may be an N-type semiconductor layer, and the second semiconductor layer may be a P-type semiconductor layer. Depending upon the luminous color of the micro LED, a matrial such as InGaN, InAlGaP, GaP, GaAsP or AlGaAs can be selected to form the light emitting layer. The light emitting layer can also be referred to as a quantum well.

Figure 7E:
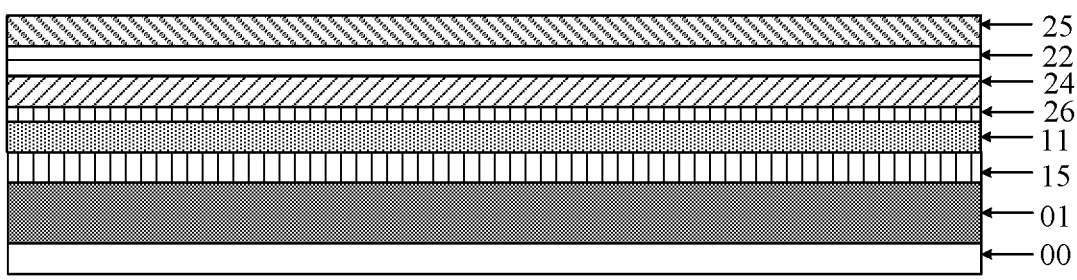
FIG. 7E is a schematic cross-sectional view showing a structure obtained by forming a buffer layer, a first semiconductor layer, a light emitting layer, and a second semiconductor layer on the gate insulating layer of FIG. 7D.

In an embodiment, as shown in FIG. 7E, a first semiconductor layer 24, a light emitting layer 22, and a second semiconductor layer 25 may be sequentially formed on the surface of a buffer layer 26 by an MOCVD process. Specifically, the base substrate may be heated to a high temperature of about 600 degrees Celsius, and TMGa and an ammonia ($NH_3$) precursor are simultaneously introduced into a reaction chamber, thereby sequentially forming on the surface of the buffer layer 26 an N-type GaN semiconductor layer 24, an InGaN or GaN quantum well 22 and a P-type GaN semiconductor layer 25.

Alternatively, the first semiconductor layer 24 and the second semiconductor layer 25 may be formed using an in-situ deposition state doping technique. The forming process may include adding a silicon precursor such as silane ($SiH_4$), disilane ($Si_2H_6$), dimethylsilane ($SiCH_8$) or dichlorosilane ($SiH_2Cl_2$) while introducing TMGa and $NH_3$ into the reaction chamber, so that the GaN is doped with Si of $10^{17}$ to $10^{20}$ cm$^{-3}$ (i.e., $10^{17}$ to $10^{20}$ Si atoms are doped per cubic centimeter of GaN), thereby depositing the N-type GaN semiconductor layer 24. Thereafter, an organic precursor of magnesium such as magnesocene ($Cp_2Mg$) is added to the reaction chamber so that Mg of $10^{17}$ to $10^{20}$ cm$^{-3}$ is doped in the GaN, thereby forming the P-type GaN semiconductor layer 25. Between the formation of the N-type semiconductor layer 24 and the P-type semiconductor layer 25, a wide bandgap material and a narrow bandgap semiconductor material, each with a thickness in the order of nanometers, may be alternately deposited by an MOCVD process. For example, a wide bandgap material aluminum gallium nitride (AlGaN) and a narrow bandgap material GaN are alternately deposited to form a variety of single quantum well or multiple quantum well structures. The wide bandgap material and the narrow bandgap material in the quantum well material have lattice constants and bands that match each other (the band difference of the two materials being kept within a certain range, for example, 1 eV), thereby being able to modulate the emission wavelength. The quantum well structure also has the advantages of high recombination efficiency and low interfacial recombination rate.

In embodiments of the present disclosure, the thickness of the buffer layer 26 may be between 0.1 and 5 micrometers, the thickness of the first semiconductor layer 24 and the second semiconductor layer 25 may be between 0.1 and 0.5 micrometers, and the thickness of the quantum well 22 may be between 0.1 and 0.5 microns.

At step 1016a, the second semiconductor layer, the light emitting layer, the first semiconductor layer, and the buffer layer are removed from the non-pixel region.

Figure 7F:
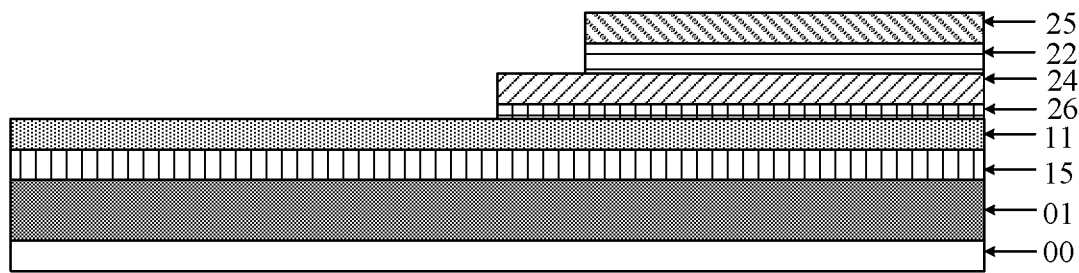
FIG. 7F is a schematic cross-sectional view showing a structure obtained by removing a film layer, which is on the gate insulating layer and located in a non-pixel region, from the structure of FIG. 7E.

In an embodiment, a one-time photolithography process may be employed to form a patterned photoresist mask on the surface of the base substrate to define pixel regions and non-pixel regions. The pixel region is an area for arranging the micro LED, that is, an effective display area of the array substrate. The non-pixel region is a non-display area. The pixel region may include a P region, a multiple quantum well (MQW) region, and an N region, of the micro LED, with the orthographic projections of the P region, the MQW region, and the N region onto the base substrate coinciding each other. Thereafter, portions of the second semiconductor layer, the light emitting layer, the first semiconductor layer, and the buffer layer that are not covered by the photoresist mask may be etched using an inductive coupled plasma emission spectrometer (ICP) etching machine. The etch depth may be 1.3 microns. The etching gas used in the ICP etching machine may be chlorine gas ($Cl_2$) and boron trichloride ($BCl_3$). Referring to FIG. 7F, on the etched base substrate, the buffer layer 26 and the first semiconductor layer 24 may have protrusions with respect to other film layers in the micro LEDs 20, which form an electrode contact region. It can also be seen with reference to FIG. 7F that the gate insulating layer 11 of the non-pixel region is exposed after the etching process.

At step 1017a, a gate electrode of the thin film transistor and a first electrode of the micro LED contacting the first semiconductor layer, are formed on a side of the gate insulating layer away from the base substrate, and a second electrode of the micro LED is formed on a side of the second semiconductor layer away from the substrate.

In an embodiment, a metal thin film may be deposited on a surface of the gate insulating layer, and then the metal thin film may be processed by a one-time patterning process to form the gate electrode of the thin film transistor and the first electrode of the micro LED that are spaced apart from each other. The first electrode may overlie the protruding first semiconductor layer 24 to achieve effective contact with the first semiconductor layer 24.

Figure 7G:
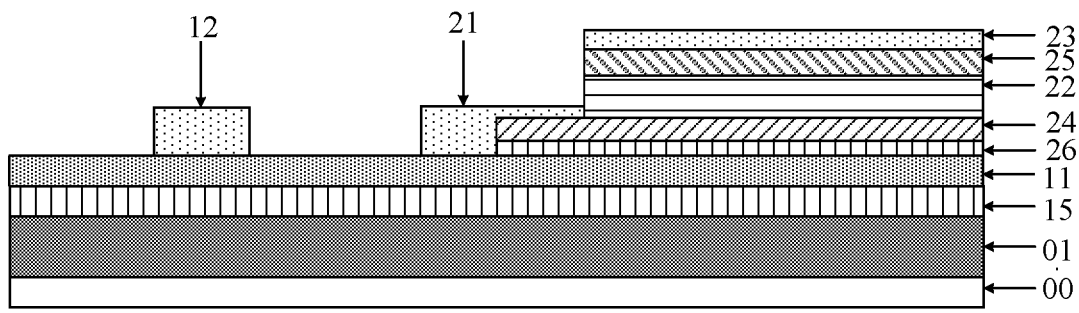
FIG. 7G is a schematic cross-sectional view showing a structure obtained by forming a gate electrode, a first electrode, and a second electrode on the structure of FIG. 7F.

Specifically, a metal thin film having a thickness of 200 to 500 nm may be deposited on a surface of the base substrate by magnetron sputtering. The metal film may be a film layer formed of one of molybdenum (Mo), molybdenum-niobium alloy (MoNb), Al, aluminum-niobium alloy (AlNd), titanium (Ti), and copper (Cu), or may be a single or multiple layer composite laminate formed from multiple ones of the above materials. For example, a Mo film layer or an Al film layer may be formed on the surface of the base substrate, or a single-layer film or a multi-layer composite film composed of an alloy of Mo and Al may be formed. Thereafter, a patterned photoresist mask may be formed on the surface of the base substrate by a one-time photolithography process to define a gate region of the thin film transistor, and a first electrode region and a second electrode region of the micro LED. Finally, the region of the metal film not covered by the photoresist mask may be etched. As shown in FIG. 7G, the gate electrode 12 of the thin film transistor, and the first electrode 21 and the second electrode 23 of the micro LED, may be obtained. The second electrode 23 is located on a side of the second semiconductor layer 25 away from the base substrate 00, and the first electrode 21 overlies the protrusion of the first semiconductor layer 24.

At step 1018a, an interlayer dielectric layer is formed on a side of the gate electrode away from the base substrate. The interlayer dielectric (ILD) layer may be formed on the side of the gate electrode away from the base substrate by a PECVD process. The interlayer dielectric layer may be a $SiO_x$ layer or a $SiN_x$ layer, or may be composed of a $SiO_x$ layer and a SiNx layer that are stacked.

Figure 7H:
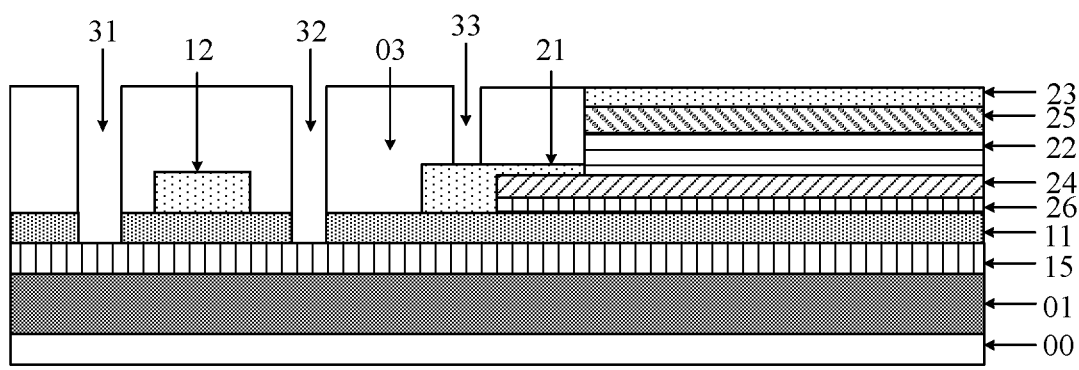
FIG. 7H is a schematic cross-sectional view showing a structure obtained by forming vias in the structure of FIG. 7G.

At step 1019a, a first via and a second via are formed on the base substrate that extend through the interlayer dielectric layer and the gate insulating layer. By means of a one-time photolithography process, the first via extending through the interlayer dielectric layer and the gate insulating layer can be formed in a source contact region on the base substrate, and the second via extending through the interlayer dielectric layer and the gate insulating layer can be formed in a drain contact region. As shown in FIG. 7H, a first via V1 and a second via 32 may be formed on the base substrate, with the first via V1 exposing the source contact region of the active layer 15 and the second via 32 exposing the drain contact region of the active layer 15.

It should be noted that the interlayer dielectric layer formed in the above step 1018a may completely cover the surface of the base substrate, and that a portion of the interlayer dielectric layer overlying the second electrode 23 may be removed at the same time when the first via and the second via are formed by the one-time photolithography process in step 1019a.

At step 1020a, a first electrode and a second electrode of the thin film transistor that are spaced apart from each other are formed on a side of the interlayer dielectric layer away from the base substrate. In an embodiment, a metal thin film may be deposited on a surface of the interlayer dielectric layer, and then the metal thin film is patterned by a one-time photolithography process to form the first electrode and the second electrode of the thin film transistor. The first electrode is in contact with the source contact region in the active layer through the first via, and the second electrode is in contact with the drain contact region of the active layer through the second via.

In this step, the metal thin film may be formed of any one of metal materials such as Cu, Al, Mo, Ti, chromium (Cr), or tungsten (W). Alternatively, the metal film may also be a multilayer metal film structure composed of a plurality of metal materials. For example, the metal film may be a three-layer metal film, and the metal materials forming the three-layer metal film may be Mo, Al, and Mo, or Ti, Al, and Ti, or Ti, Cu, and Ti, or Mo, Cu, and Ti.

As an alternative implementation, the method may further include, before step 1020a, forming a first contact via in the interlayer dielectric layer to expose the first electrode. The first contact via may be formed in synchronization with the first via and the second via. As shown in FIG. 7H, a first contact via 33 can be formed. The second electrode of the thin film transistor formed in the above step 1020a may also be connected to the first electrode 21 through the first contact via 33, and the second electrode 23 may be connected to the common electrode 30. The structure of the finally formed array substrate can be seen with reference to FIG. 2A, 4A or 5A.

As another alternative implementation, a side of the second electrode, which is closer to the base substrate, of the thin film transistor formed in the above step 1020a, may be in contact with a side of the second electrode of the micro LED away from the base substrate. That is, the second electrode 14 of the thin film transistor is connected to the second electrode 23 of the micro LED, and the first electrode 21 of the micro LED is connected to the common electrode 30. The structure of the finally formed array substrate can be seen with reference to FIG. 2B, 4B or 5B.

It should be noted that the method shown in FIG. 7A above is exemplary, and that the order of the steps may be adjusted where appropriate. For example, the gate electrode and the first electrode may be formed first, and then the buffer layer, the first semiconductor layer, the light emitting layer, the second semiconductor layer, and the second electrode in the micro LED may be sequentially formed. That is, the operation of forming the gate electrode and the first electrode in the above step 1017a may be performed before step 1014a, the operation of forming the second electrode in the above step 1017a may be performed after step 1016a, and the above step 1016a may be omitted.

Figure 8A:
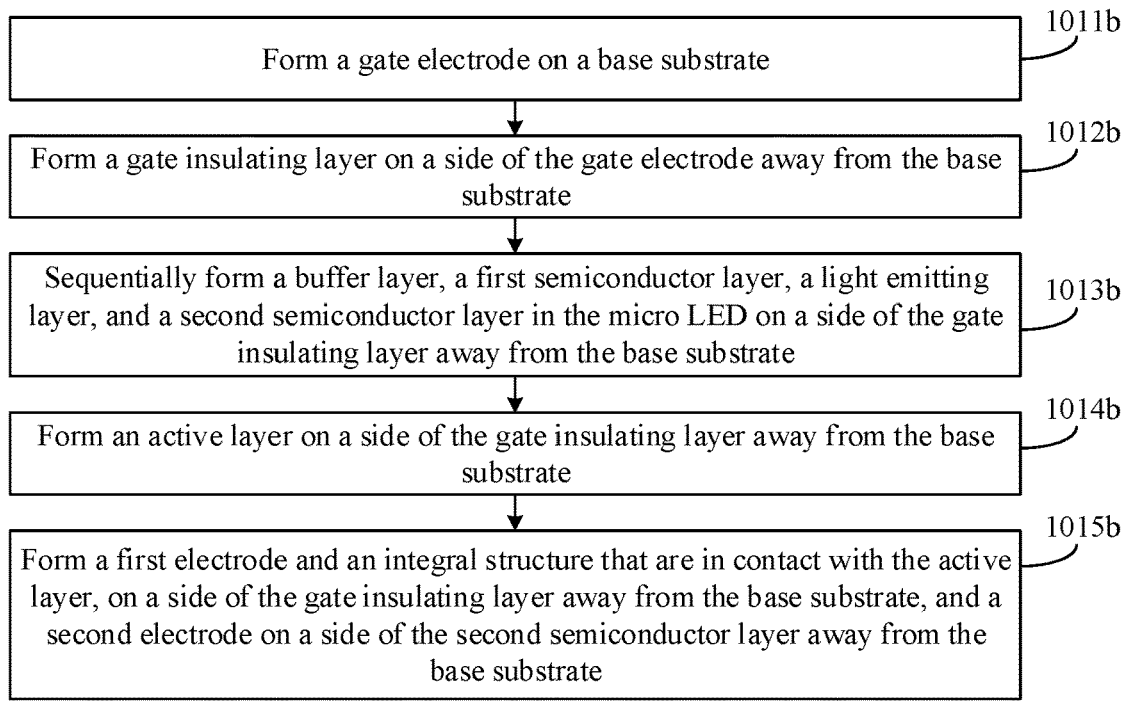
FIG. 8A is a flow chart of a method of manufacturing a thin film transistor according to an embodiment of the present disclosure.

A method of manufacturing an array substrate of a thin film transistor having a bottom gate structure will be described below with reference to FIGS. 8A and 3A.

At step 1011b, a gate electrode 12 is formed on a base substrate 00.

At step 1012b, a gate insulating layer 11 is formed on a side of the gate electrode 12 away from the base substrate 00.

At step 1013b, a buffer layer 26, a first semiconductor layer 24, a light emitting layer 22, and a second semiconductor layer 25 in the micro LED 20 are sequentially formed on a side of the gate insulating layer 11 away from the base substrate 00.

At step 1014b, an active layer 15 is formed on a side of the gate insulating layer 11 away from the base substrate 00.

At step 1015b, a first electrode 13 and an integral structure that are in contact with the active layer 15 are formed on a side of the gate insulating layer 11 away from the base substrate 00, and a second electrode 23 is formed on a side of the second semiconductor layer 25 away from the base substrate 00.

One end of the integral structure that is in contact with the active layer 15 forms the second electrode 14 of the thin film transistor 10, and the other end of the integral structure is in contact with the first semiconductor layer 24 of the micro LED 20 to form the first electrode 21 of the micro LED 20.

The above steps 1011b to 1015b may be performed according to the corresponding steps in the embodiment described above with reference to FIG. 7A, and are not described in detail herein again.

Figure 8B:
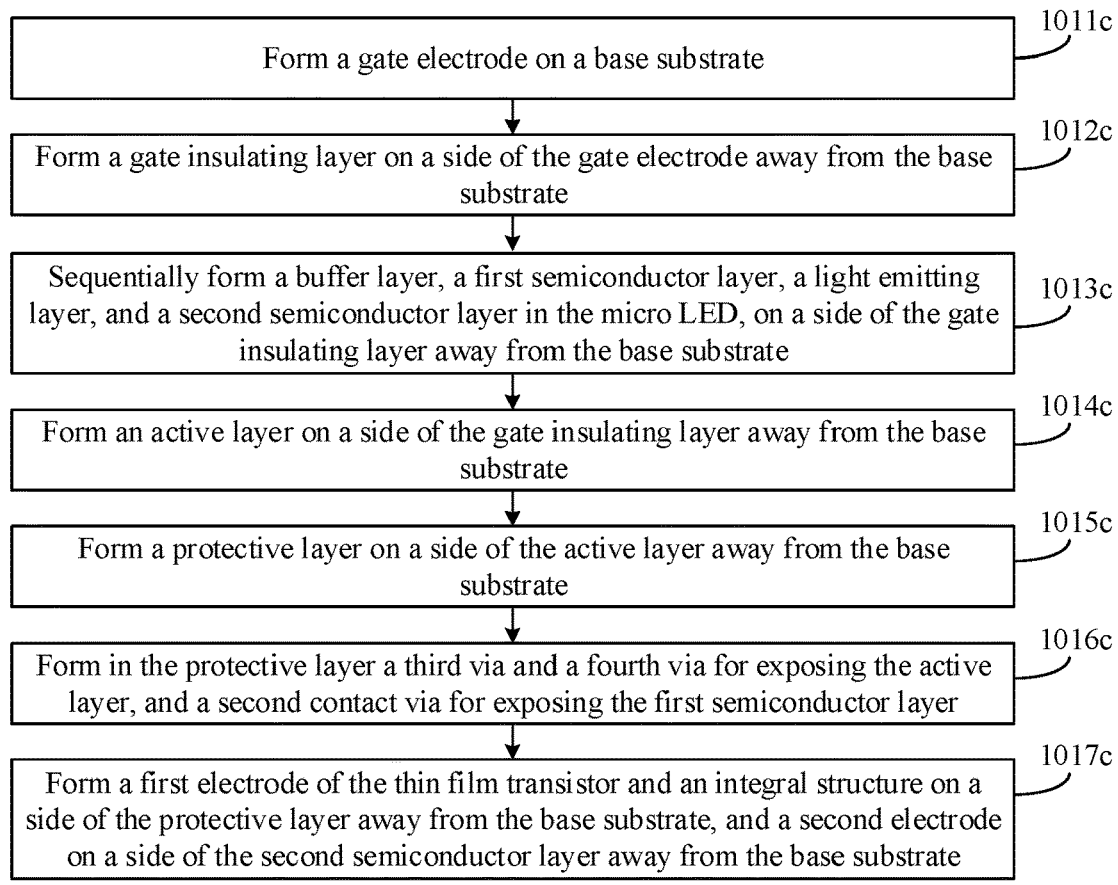
FIG. 8B is a flowchart of a method of manufacturing a thin film transistor according to another embodiment of the present disclosure.

A method of manufacturing an array substrate of a thin film transistor having a bottom gate structure will be described below with reference to FIGS. 8B and 3B.

At step 1011c, a gate electrode 12 is formed on a base substrate 00.

At step 1012c, a gate insulating layer 11 is formed on a side of the gate electrode 12 away from the base substrate 00.

At step 1013c, a buffer layer 26, a first semiconductor layer 24, a light emitting layer 22, and a second semiconductor layer 25 in the micro LED 20 are sequentially formed on a side of the gate insulating layer 11 away from the base substrate 00.

At step 1014c, an active layer 15 is formed on a side of the gate insulating layer 11 away from the base substrate 00.

At step 1015c, a protective layer 16 is formed on a side of the active layer 15 away from the base substrate 00.

At step 1016c, a third via V3 and a fourth via V4 for exposing the active layer 15 are formed in the protective layer 16, and a second contact via CV2 is formed for exposing the first semiconductor layer 24.

At step 1017c, a first electrode 13 of the thin film transistor 10 and an integral structure are formed on a side of the protective layer 16 away from the base substrate 00, and a second electrode 23 is formed on a side of the second semiconductor layer 25 away from the base substrate 00.

The first electrode 13 is connected to the active layer 15 through the third via V3. One end of the integral structure is connected to the active layer 15 through the fourth via V4 to form the second electrode 14 of the thin film transistor 10, and the other end of the integrated structure is connected to the first semiconductor layer 24 through the second contact via CV2 to form the first electrode 21 of the micro LED 20.

The above steps 1011c to 1017c may be performed according to the corresponding steps in the embodiment described above with reference to FIG. 7A, and are not described in detail herein again.

The fabrication of the common electrode 30 will be described below with reference to FIGS. 4A, 4B, 5A, and 5B.

Referring to FIG. 4A, the common electrode 30 and the first electrode 21 of the micro LED 20 may be formed in the same layer by a one-time patterning process. After the second electrode 23 of the micro LED 20 is formed, a third contact via CV3 is formed to expose the common electrode 30. In this example, the third contact via CV3 may be formed while forming the first contact via CV1 in the interlayer dielectric layer 03. A connection electrode 31 is formed on a side of the second electrode 23 away from the base substrate 00, and the connection electrode 31 is connected to the common electrode 30 through the third contact via CV3. In this example, the connection electrode 31 may be formed in the same layer as the first electrode 13 and the second electrode 14 of the thin film transistor 10 by a one-time patterning process.

Referring to FIG. 4B, the common electrode 30 and the first electrode 21 of the micro LED 20 may be formed in the same layer by a one-time patterning process. In this example, the common electrode 30 and the first electrode 21 may be of an integral structure, that is, the common electrode 30 may be directly used as the first electrode 21 of the micro LED 20.

Referring to FIG. 5A, the common electrode 30 is formed on a side of the second electrode 23 of the micro LED 20 away from the base substrate 00, and an insulating layer 32 is formed between the common electrode 30 and the second electrode 23. A fourth contact via CV4 is formed in the insulating layer 32 to expose the second electrode 23. The common electrode 30 is connected to the second electrode 23 through the fourth contact via CV4.

Referring to FIG. 5B, an insulating layer 32 is further formed on a side of the second electrode 23 away from the base substrate 00. A fifth contact via CV5 for exposing the first electrode 21 is formed in the insulating layer 32 and the interlayer dielectric layer 03. The common electrode 30 is formed on a side of the insulating layer 32 away from the base substrate 00, and is connected to the first electrode 21 through the fifth contact via CV5.

Figure 9:
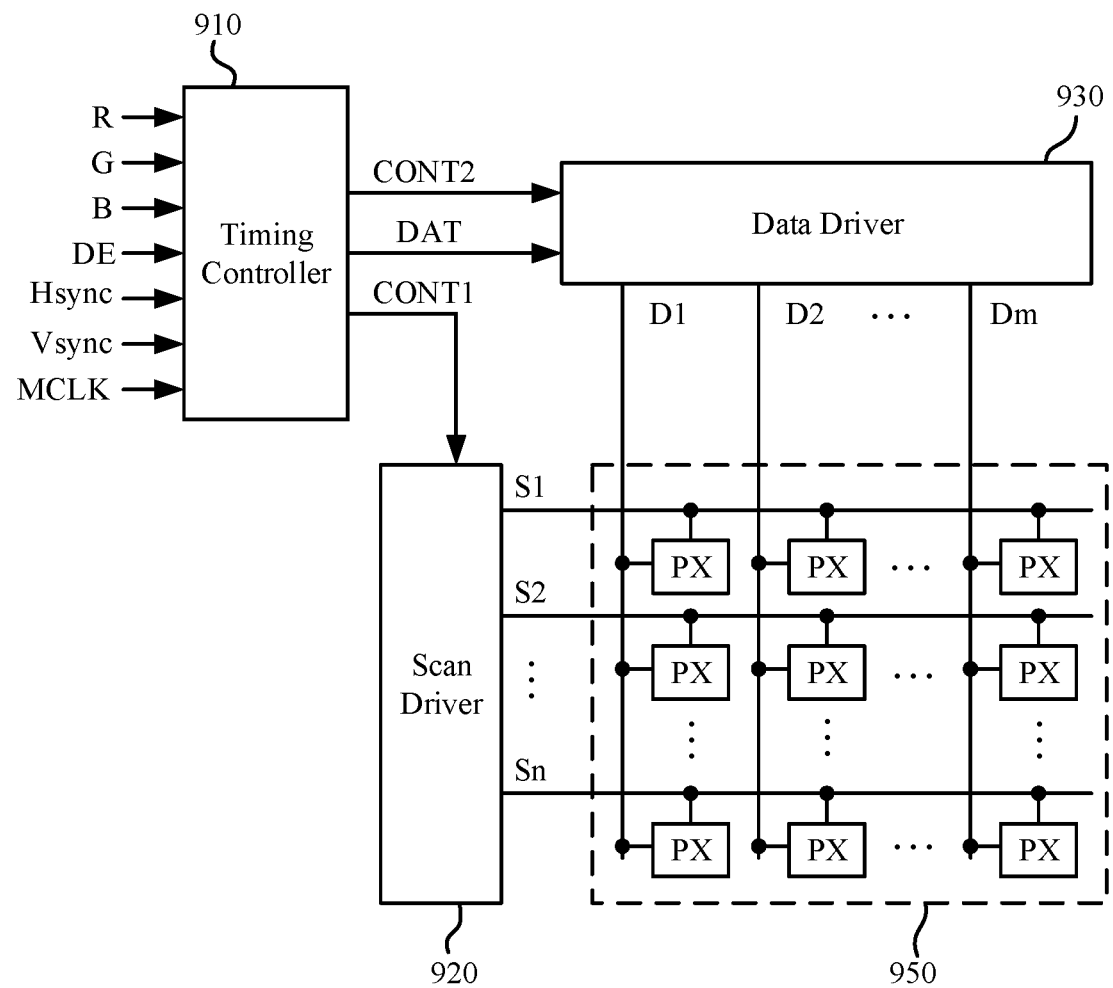
FIG. 9 is a schematic block diagram of a display device according to an embodiment of the present disclosure.

FIG. 9 is a schematic block diagram of a display device according to an embodiment of the present disclosure. The display device may be any product or component having a display function such as a liquid crystal panel, an electronic paper, a mobile phone, a tablet computer, a television, a display, a notebook computer, a digital photo frame, a navigator, and the like.

Referring to FIG. 9, the display device includes a timing controller 910, a scan driver 920, a data driver 930, and a display substrate 950.

The timing controller 910 receives synchronization signals and video signals R, and B from a system interface. The synchronization signals include a horizontal synchronization signal Hsync, a vertical synchronization signal Vsync, a main clock signal MCLK, and a data enable signal DE. The video signals R, G, and B contain luminance information of each of a plurality of pixels PX. The timing controller 910 generates a first driving control signal CONT1, a second driving control signal CONT2, and an image data signal DAT according to the video signals R, G, and B, the horizontal synchronization signal Hsync, the vertical synchronization signal Vsync, the data enable signal DE, and the main clock signal MCLK.

The display substrate 950 includes the pixels PX arranged substantially in a matrix form. In the display substrate 950, a plurality of substantially parallel scan lines S1 to Sn extend in a row direction, and a plurality of substantially parallel data lines D1 to Dm extend in a column direction. The scan lines S1 to Sn and the data lines D1 to Dm are connected to the pixels PX. The display substrate 950 can take the form of any of the array substrate embodiments described above with respect to FIGS. 1 through 5B.

The scan driver 920 is connected to the scan lines S1-Sn, and generates corresponding scan signals S[1] to S[n] according to the first drive control signal CONT1. The scan driver 920 can sequentially apply the scan signals S[1] to S[n] to the scan lines S1 to Sn.

The data driver 930 is connected to the data lines D1 to Dm, samples and holds the image data signal DAT according to the second driving control signal CONT2, and applies a plurality of data signals D[1] to D[m] to the data lines D1 to Dm, respectively. The data driver 930 can program the data to the pixels PX by applying the data signals D[1] to D[m] to the data lines D1 to Dm in synchronization with the scan signals S[1] to S[n].

The foregoing are only specific embodiments of the present application, and are not intended to limit the application. Modifications, equivalent substitutions or improvements to the described embodiments can be made by a person having ordinary skill in the art without departing from the scope of the present application.

What is claimed is:

1. An array substrate, comprising:
    a base substrate;
    a thin film transistor on the base substrate, the thin film transistor comprising a gate electrode connected to a gate line, an active layer, a gate insulating layer insulating the gate electrode from the active layer, a first conductive electrode connected to a data line, and a second conductive electrode spaced apart from the first conductive electrode;
    a micro light emitting diode on a side of the gate insulating layer away from the base substrate, the micro light emitting diode comprising a first electrode, a light emitting layer and a second electrode; and
    a common electrode,
    wherein the second conductive electrode of the thin film transistor is connected to one of the first and second electrodes of the micro light emitting diode,
    wherein the other of the first and second electrodes of the micro light emitting diode is connected to the common electrode, and
    wherein the thin film transistor is of a structure selected from a group consisting of a top gate structure in which the gate electrode is in a same layer and made of a same film as and spaced apart from the first electrode of the micro light emitting diode, and a bottom gate structure in which the second conductive electrode of the thin film transistor is made of a same film and constituted of a same continuous integral structure as the first electrode of the micro light emitting diode, or, the second conductive electrode of the thin film transistor is directly physically and electrically connected to the second electrode of the micro light emitting diode.

2. The array substrate of claim 1, wherein the micro light emitting diode further comprises:
    a first semiconductor layer on a side of the light emitting layer closer to the base substrate, and
    a second semiconductor layer between the light emitting layer and the second electrode of the micro light emitting diode,
    wherein the first semiconductor layer is in contact with the first electrode of the micro light emitting diode.

3. The array substrate of claim 2,
    wherein the micro light emitting diode further comprises a buffer layer between the first semiconductor layer and the gate insulating layer, and
    wherein the buffer layer and the first electrode of the micro light emitting diode are located on the side of the gate insulating layer away from the base substrate.

4. The array substrate of claim 1, wherein the gate insulating layer is made of a metal oxide material comprising at least one selected from a group consisting of aluminum oxide, iron oxide, chromium oxide, titanium trioxide, vanadium oxide, ferrous titanate, magnesium titanate, lanthanum oxide, cerous oxide, gallium oxide, scandium oxide, samarium oxide, europium oxide, terbium oxide, dysprosium oxide, yttrium oxide, holimium oxide, thulium oxide, lutetium oxide, and neodymium oxide.

5. The array substrate of claim 1,
    wherein the thin film transistor is of the top gate structure,
    wherein the array substrate further comprises an interlayer dielectric layer on a side of the gate electrode away from the base substrate,
    wherein the gate insulating layer is disposed on a side of the gate electrode closer to the base substrate,
    wherein the active layer is disposed on a side of the gate insulating layer closer to the base substrate,
    wherein the first conductive and second conductive electrodes of the thin film transistor are disposed on a side of the interlayer dielectric layer away from the base substrate,
    wherein the first conductive electrode of the thin film transistor is connected to the active layer through a first via disposed in the interlayer dielectric layer, and
    wherein the second conductive electrode of the thin film transistor is connected to the active layer through a second via disposed in the interlayer dielectric layer.

6. The array substrate of claim 5,
    wherein the second conductive electrode of the thin film transistor is connected to the first electrode of the micro light emitting diode through a first contact via in the interlayer dielectric layer, and
    wherein the second electrode of the micro light emitting diode is connected to the common electrode.

7. The array substrate of claim 5,
    wherein the second conductive electrode of the thin film transistor is in contact with the second electrode of the micro light emitting diode, and
    wherein the first electrode of the micro light emitting diode is connected to the common electrode.

8. The array substrate of claim 1,
    wherein the thin film transistor is of the bottom gate structure in which the second conductive electrode of the thin film transistor forms the integral structure with the first electrode of the micro light emitting diode,
    wherein one end of the integral structure is in contact with the active layer to form the second conductive electrode of the thin film transistor, and
    wherein another end of the integral structure forms the first electrode of the micro light emitting diode.

9. The array substrate of claim 1,
wherein the thin film transistor is of the bottom gate structure in which the second conductive electrode of the thin film transistor forms the integral structure with the first electrode of the micro light emitting diode,
wherein the array substrate further comprises a protective layer on a side of the active layer away from the base substrate, and
wherein the first conductive electrode of the thin film transistor and the integral structure are disposed on a side of the protective layer away from the base substrate,
wherein the first conductive electrode of the thin film transistor is connected to the active layer through a third via in the protective layer,
wherein one end of the integral structure is connected to the active layer through a fourth via in the protective layer to form the second conductive electrode of the thin film transistor, and
wherein another end of the integral structure forms the first electrode of the micro light emitting diode.

10. The array substrate of claim 1,
wherein the common electrode is disposed in a same layer as the first electrode of the micro light emitting diode,
wherein the second conductive electrode of the thin film transistor is connected to the first electrode of the micro light emitting diode,
wherein the first electrode of the micro light emitting diode is spaced apart from the common electrode,
wherein the second electrode of the micro light emitting diode is in contact with a connection electrode, and
wherein the connection electrode is connected to the common electrode through a third contact via.

11. The array substrate of claim 1,
wherein the common electrode is disposed on a side of the second electrode of the micro light emitting diode away from the base substrate,
wherein the array substrate further comprises an insulating layer between the common electrode and the second electrode,
wherein the second conductive electrode of the thin film transistor is connected to the first electrode of the micro light emitting diode, and
wherein the common electrode is connected to the second electrode of the micro light emitting diode through a fourth contact via in the insulating layer.

12. A display device comprising the array substrate of claim 1.

13. The array substrate of-claim 1,
wherein the common electrode is disposed in a same layer as the first electrode of the micro light emitting diode,
wherein the second conductive electrode of the thin film transistor is connected to the second electrode of the micro light emitting diode, and
wherein the first electrode of the micro light emitting diode forms an integral structure with the common electrode.

14. The array substrate of claim 1,
wherein the common electrode is disposed on a side of the second electrode of the micro light emitting diode away from the base substrate,
wherein the array substrate further comprises an insulating layer between the common electrode and the second electrode,
wherein the second conductive electrode of the thin film transistor is connected to the second electrode of the micro light emitting diode, and
wherein the common electrode is connected to the first electrode of the micro light emitting diode through a fifth contact via extending through the insulating layer.

15. A method of manufacturing an array substrate, comprising:
forming a thin film transistor on a base substrate, and a micro light emitting diode on a side of a gate insulating layer, away from the base substrate, of the thin film transistor, wherein the thin film transistor comprises a gate electrode connected to a gate line, an active layer, the gate insulating layer insulating the gate electrode from the active layer, a first conductive electrode connected to a data line, and a second conductive electrode spaced apart from the first conductive electrode, and wherein the micro light emitting diode comprises a first electrode, a light emitting layer, and a second electrode;
connecting the second conductive electrode of the thin film transistor to one of the first and second electrodes of the micro light emitting diode; and
connecting the other of the first and second electrodes of the micro light emitting diode to a common electrode,
wherein the thin film transistor is of a structure selected from a group consisting of a top gate structure in which the gate electrode is in a same layer and made of a same film as and spaced apart from the first electrode of the micro light emitting diode, and a bottom gate structure in which the second conductive electrode of the thin film transistor is made of a same film and constituted of a same continuous integral structure as the first electrode of the micro light emitting diode, or, the second conductive electrode of the thin film transistor is directly physically and electrically connected to the second electrode of the micro light emitting diode.

16. The method of claim 15, wherein the forming the micro light emitting diode comprises:
sequentially forming a first semiconductor layer, the light emitting layer, and a second semiconductor layer on a side of the gate insulating layer away from the base substrate;
forming the first electrode of the micro light emitting diode, which is in contact with the first semiconductor layer, on the side of the gate insulating layer away from the base substrate; and
forming the second electrode of the micro light emitting diode on a side of the second semiconductor layer away from the base substrate.

17. The method of claim 15,
wherein the thin film transistor is of the top gate structure in which the gate electrode is in the same layer as and spaced apart from the first electrode of the micro light emitting diode, and
wherein the forming the thin film transistor comprises:
forming the active layer on the base substrate;
forming the gate insulating layer on a side of the active layer away from the base substrate;
forming the gate electrode on a side of the gate insulating layer away from the base substrate;
forming an interlayer dielectric layer on a side of the gate electrode away from the base substrate;
forming, on the base substrate, a first via and a second via extending through the interlayer dielectric layer and the gate insulating layer; and
forming the first conductive and second conductive electrodes of the thin film transistor on a side of the interlayer dielectric layer away from the base substrate, wherein the first conductive electrode of the thin film transistor is connected to the active layer through the first via, and wherein the second conductive electrode of the thin film transistor is connected to the active layer through the second via.

18. The method of claim 15, wherein the thin film transistor is of the bottom gate structure in which the second conductive electrode of the thin film transistor forms an integral structure with the first electrode of the micro light emitting diode, and wherein the forming the thin film transistor comprises:

sequentially forming, on the base substrate, the gate electrode, the gate insulating layer, and the active layer of the thin film transistor; and forming the first conductive electrode of the thin film transistor and the integral structure on the base substrate, wherein one end of the integral structure is in contact with the active layer to form the second conductive electrode of the thin film transistor, and wherein another end of the integral structure forms the first electrode of the micro light emitting diode.

19. The method of claim 15, wherein the thin film transistor is of the bottom gate structure in which the second conductive electrode of the thin film transistor forms the integral structure with the first electrode of the micro light emitting diode, and wherein the forming the thin film transistor comprises:

forming, on the base substrate, the gate electrode, the gate insulating layer and the active layer of the thin film transistor;

forming a protective layer on a side of the active layer away from the base substrate;

forming, in the protective layer, a third via and a fourth via to expose the active layer, and a second contact via to expose a first semiconductor layer of the micro light emitting diode; and forming the first conductive electrode of the thin film transistor and the integral structure on a side of the protective layer away from the base substrate, wherein the first conductive electrode of the thin film transistor is connected to the active layer through the third via, wherein one end of the integral structure is connected to the active layer through the fourth via to form the second conductive electrode of the thin film transistor, and wherein another end of the integral structure is connected to the first semiconductor layer through the second contact via to form the first electrode of the micro light emitting diode.

* * * * *